United States Patent
Oxland

(10) Patent No.: US 10,049,946 B2
(45) Date of Patent: Aug. 14, 2018

(54) VERTICAL CMOS STRUCTURE AND METHOD

(71) Applicant: Taiwan Semiconductor Manufacturing Company, Ltd., Hsin-Chu (TW)

(72) Inventor: Richard Kenneth Oxland, Brussels (BE)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 17 days.

(21) Appl. No.: 15/295,734

(22) Filed: Oct. 17, 2016

(65) Prior Publication Data
US 2017/0033021 A1 Feb. 2, 2017

Related U.S. Application Data

(62) Division of application No. 14/640,295, filed on Mar. 6, 2015, now Pat. No. 9,472,551.
(Continued)

(51) Int. Cl.
*H01L 21/8238* (2006.01)
*H01L 27/092* (2006.01)
(Continued)

(52) U.S. Cl.
CPC .. *H01L 21/823885* (2013.01); *H01L 21/0262* (2013.01); *H01L 21/02381* (2013.01);
(Continued)

(58) Field of Classification Search
CPC .................. H01L 21/823885; H01L 21/02381
See application file for complete search history.

(56) References Cited

U.S. PATENT DOCUMENTS

| | | | |
|---|---|---|---|
| 4,788,158 A | 11/1988 | Chatterjee | |
| 5,308,778 A | 5/1994 | Fitch et al. | |

(Continued)

FOREIGN PATENT DOCUMENTS

| JP | 2007059680 A | 3/2007 |
|---|---|---|
| JP | 2007250652 A | 9/2007 |
| JP | 2009152344 A | 7/2009 |

OTHER PUBLICATIONS

Borg, et al., "Vertical III-V Nanowire Device Integration on Si(100)," American Chemical Society Nano Lett. 14, Mar. 14, 2014, pp. 1914-1920.

(Continued)

*Primary Examiner* — Marc Armand
(74) *Attorney, Agent, or Firm* — Slater Matsil, LLP

(57) ABSTRACT

A method for forming stacked, complementary transistors is disclosed. Selective deposition techniques are used to form a column having a lower portion that includes one type of semiconductor (e.g. germanium) and an upper portion of another type of semiconductor (e.g. indium arsenide. The lower portion of the column provides a channel region for a transistor of one type, while the upper column provides a channel region for a transistor of another type. This provides a complementary pair that occupies a minimum of integrated circuit surface area. The complementary transistors can be utilized in a variety of circuit configurations. Described are complementary transistors where the lower transistor is p-type and the upper transistor is n-type.

20 Claims, 40 Drawing Sheets

Related U.S. Application Data

(60) Provisional application No. 62/115,986, filed on Feb. 13, 2015.

(51) Int. Cl.

| | | |
|---|---|---|
| *H01L 29/78* | (2006.01) | |
| *H01L 29/16* | (2006.01) | |
| *H01L 29/20* | (2006.01) | |
| *H01L 29/10* | (2006.01) | |
| *H01L 21/8258* | (2006.01) | |
| *H01L 29/66* | (2006.01) | |
| *H01L 21/02* | (2006.01) | |
| *H01L 27/06* | (2006.01) | |
| *H01L 29/06* | (2006.01) | |
| *H01L 29/423* | (2006.01) | |
| *H01L 29/786* | (2006.01) | |

(52) U.S. Cl.
CPC .. *H01L 21/02532* (2013.01); *H01L 21/02546* (2013.01); *H01L 21/02603* (2013.01); *H01L 21/02636* (2013.01); *H01L 21/8258* (2013.01); *H01L 21/823807* (2013.01); *H01L 21/823828* (2013.01); *H01L 21/823871* (2013.01); *H01L 21/823878* (2013.01); *H01L 27/0688* (2013.01); *H01L 27/092* (2013.01); *H01L 29/0649* (2013.01); *H01L 29/0676* (2013.01); *H01L 29/1037* (2013.01); *H01L 29/16* (2013.01); *H01L 29/20* (2013.01); *H01L 29/42392* (2013.01); *H01L 29/66666* (2013.01); *H01L 29/7827* (2013.01); *H01L 29/78618* (2013.01); *H01L 29/78642* (2013.01); *H01L 29/78681* (2013.01); *H01L 29/78684* (2013.01); *H01L 29/78696* (2013.01)

(56) References Cited

U.S. PATENT DOCUMENTS

| | | | |
|---|---|---|---|
| 2005/0073051 A1* | 4/2005 | Yamamoto | H01L 21/02063 257/758 |
| 2009/0004797 A1* | 1/2009 | Lee | H01L 27/10876 438/270 |
| 2009/0194813 A1 | 8/2009 | Fujimoto | |
| 2014/0225184 A1 | 8/2014 | Colinge et al. | |

OTHER PUBLICATIONS

Tomioka, K., et al., "A III-V Nanowire Channel on Silicon for High-Performance Vertical Transistors," Nature, vol. 488, Aug. 9, 2012, pp. 189-193.

* cited by examiner

VERTICAL CMOS STRUCTURE AND METHOD

PRIORITY CLAIM AND CROSS-REFERENCE

This application is a divisional application of U.S. patent application Ser. No. 14/640,295, filed Mar. 6, 2015, entitled "Vertical CMOS Structure And Method," which claims priority to U.S. Provisional Application Ser. No. 62/115,986, filed on Feb. 13, 2015 and entitled "Vertical CMOS Structure and Method," which applications are hereby incorporated herein by reference in their entirety.

TECHNICAL FIELD

The present disclosure relates generally to a semiconductor device structures, and, in particular embodiments, to a structure providing vertical complementary transistors and methods for fabricating the structure.

BACKGROUND

The goal of putting more and more devices into integrated circuits has been an important goal in semiconductor manufacturing from the very invention of the integrated circuit. Higher density circuits allow for the manufacture of ever more powerful devices while greatly reducing costs on a per transistor basis. The traditional configuration of circuit elements is to form them laterally on the surface of a semiconductor substrate. This provides ease of manufacturing and reduced complexity. However, currently, semiconductor design engineers are struggling with many limitations to lateral devices.

The greatest challenge is the limits of lithography. The layers of integrated circuits are fabricated by patterning various components using photolithography. In photolithography, a layer of photo-sensitive material called photoresist is coated onto the device. Then the photoresist is exposed a light pattern corresponding to the desired patterns in a particular layer. However, components in integrated circuits have become so small that their size is on the order of the wavelength of light used to expose the photoresist. While various techniques have been employed to push this limitation beyond all reasonable expectation, at some point, this physical limitation will become insurmountable.

To address this challenge, engineers have devised vertically oriented devices. These devices are complex to manufacture. However, they hold the promise of providing compact devices with the functionality of devices that consume much more semiconductor surface area, but without the need to pattern smaller features lithographically. One such vertical device is the vertical gate all-around (VGAA) or nanowire (NW) device.

Of note, prior VGAA or NW techniques provide a transistor of a specific conductivity type. In complementary metal-oxide-semiconductor (CMOS) technology, it is desirable to couple every nMOS transistor to a pMOS transistor. This minimizes off-state leakage in CMOS circuits. To achieve this using prior art VGAA techniques, separate n-channel and p-channel areas must be provided, thus occupying more integrated circuit surface area.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely structure using stacked vertical gate-all-around (VGAA) or nanowire (NW) transistors. Even so, the inventive concepts disclosed herein are not limited to the formation of specific structures. Indeed, other structures may also be formed using the inventive concepts disclosed herein. In addition, even though the disclosure is directed toward embodiments VGAA or NW circuits, the inventive concepts disclosed herein may be applied to other types of integrated circuits, electronic structures, and the like.

Figure 1:
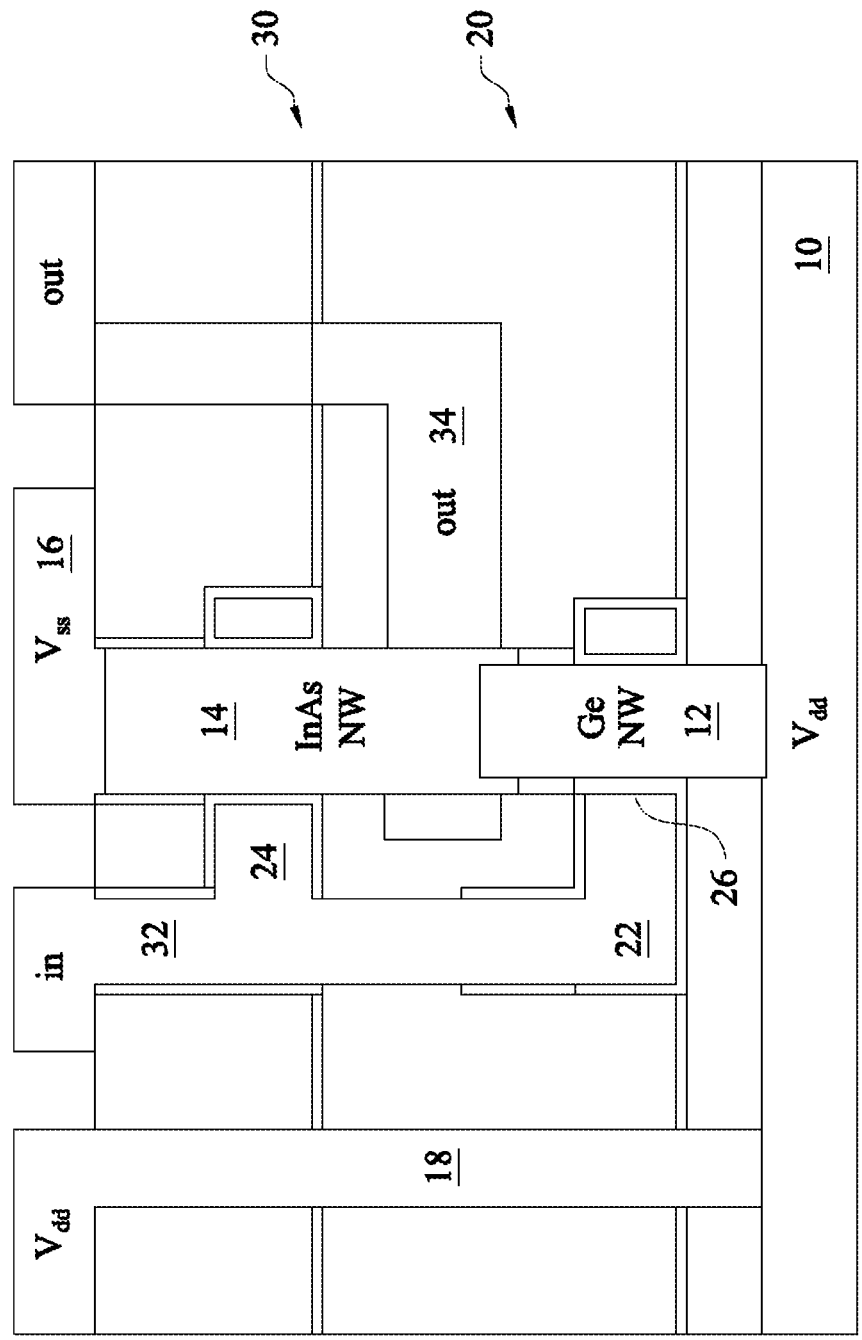
FIG. 1 is a side view of one embodiment of the present disclosure providing a pair of stacked, complementary transistors.

FIG. 1 shows a side view of one embodiment of the present disclosure. Substrate 10 is a crystalline silicon substrate doped to provide conductivity. Germanium nanowire 12 is formed on the surface of substrate 10 and provides the channel area for p-type transistor 20. Indium Arsenide nanowire 14 is formed on nanowire 12 to provide the channel area for n-type transistor 30. A low reference voltage $V_{ss}$ is provided to the top of nanowire 14 through contact 16. A high reference voltage $V_{dd}$ is provided to substrate 10 through contact 18. It should be noted that a separate $V_{dd}$ contact for each transistor pair is not necessary. A contact such as contact 18 can provide $V_{dd}$ to many transistor pairs.

Gates 22 and 24 provide the gates for transistors 20 and 30, respectively. Gate 22 is separated from nanowire 12 by gate insulator 26. Gate 24 is separated from nanowire 14 by gate insulator 28. In this embodiment, gates 22 and 24 are connected together by contact 32. However, in other configurations, gates 22 and 24 may have separate contacts to allow for differing circuit configurations. Output contact 34 is in contact with nanowire 14 near the junction between nanowire 12 and nanowire 14. This provides an output for the invertor formed by transistors 20 and 30.

Figure 3:
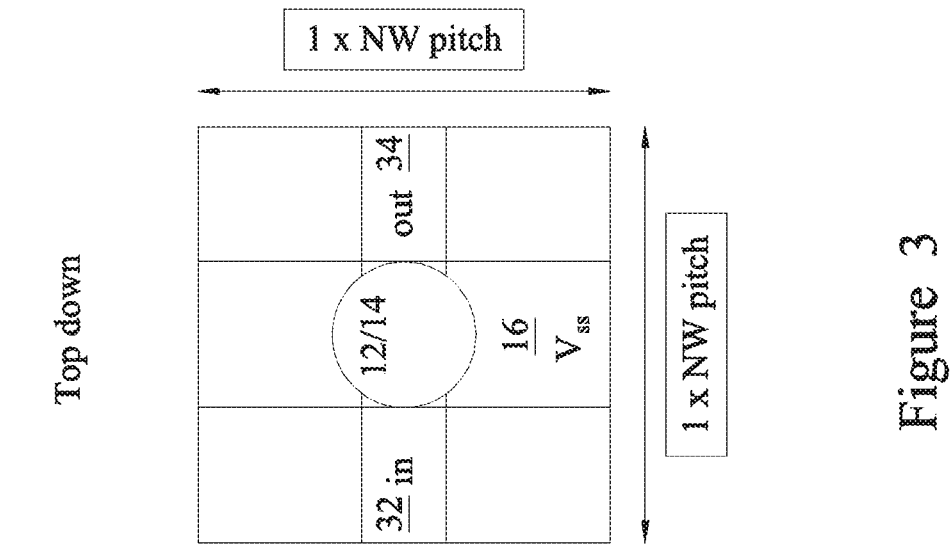
FIG. 3 is a plan view of the embodiment of FIG. 1.
Figure 2:
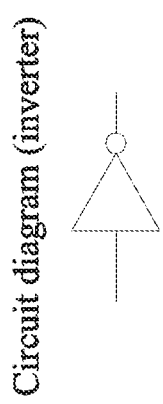
FIG. 2 is a schematic diagram of the embodiment of FIG. 1.

FIG. 2 is a schematic representation of the device of FIG. 1, with the components labeled correspondingly. FIG. 3 shows a plan view of the device of FIG. 1.

Figure 4A:
FIGS. 4A-4V are plan views showing a process, which comprises another embodiment of the present disclosure, for forming the embodiment of FIG. 1.
Figure 4B:
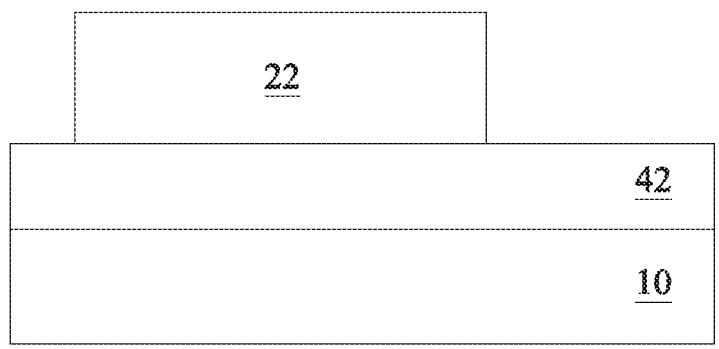
Figure 4C:
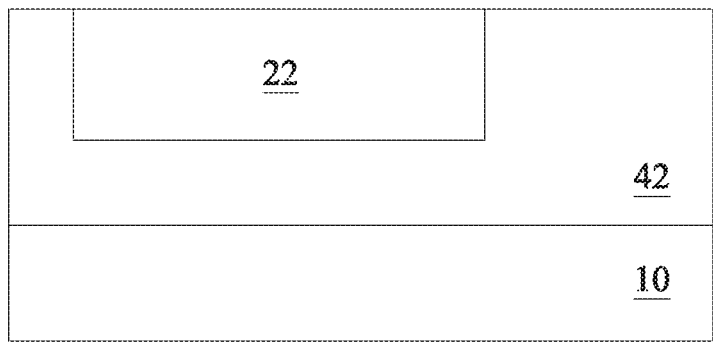
Figure 4D:
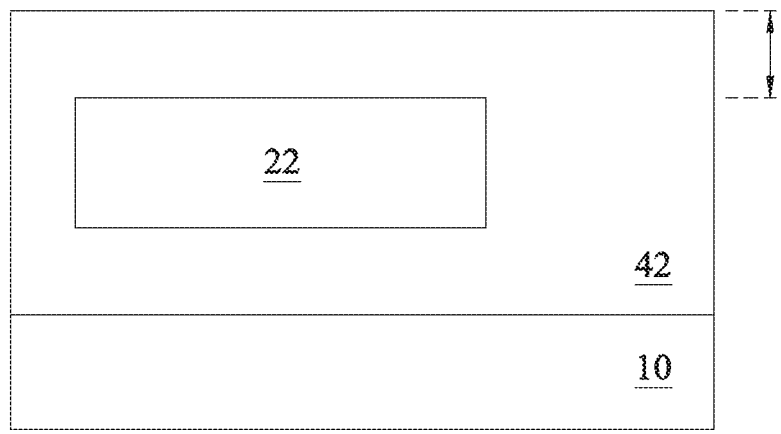
Figure 4E:
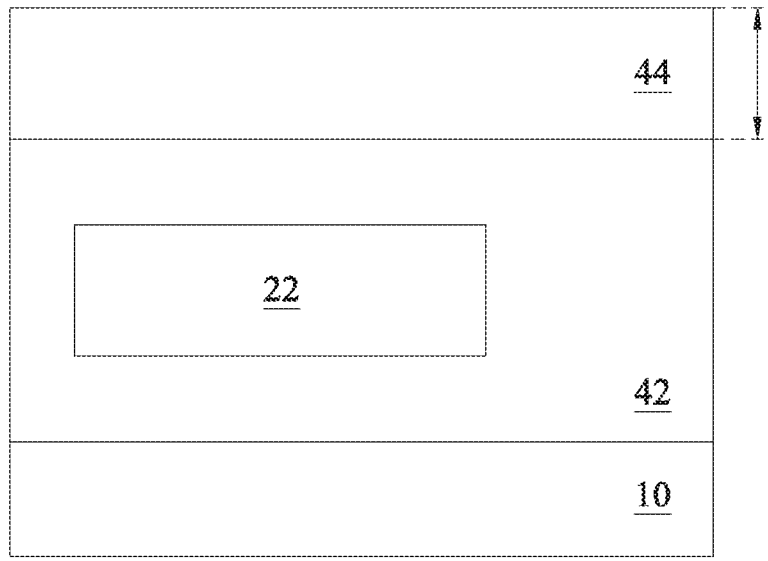
Figure 4F:
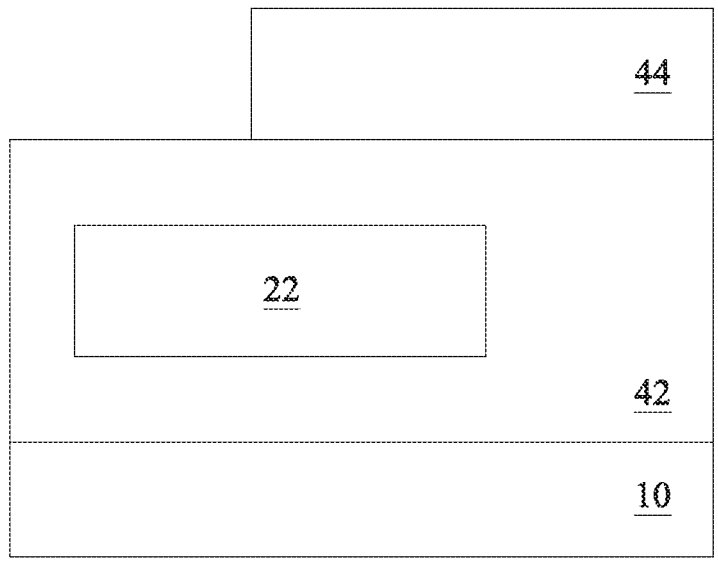
Figure 4G:
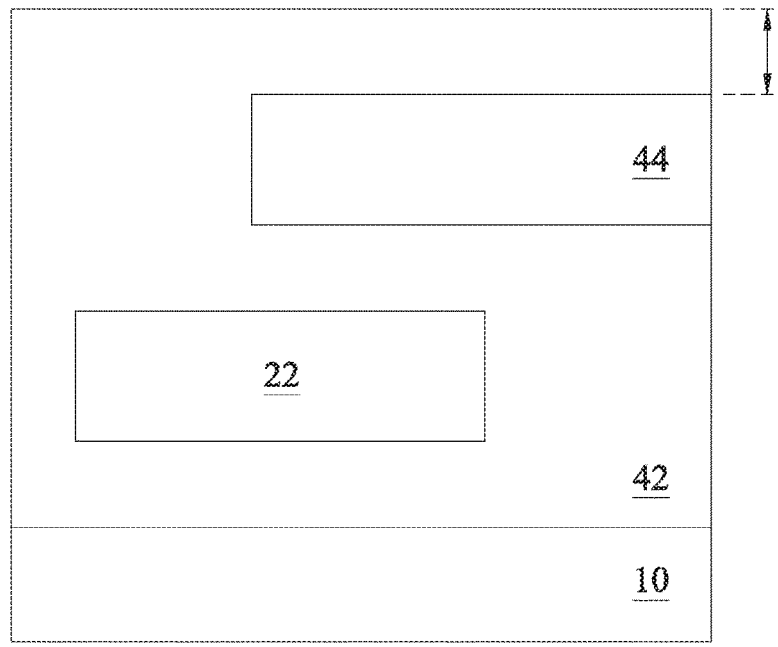
Figure 4H:
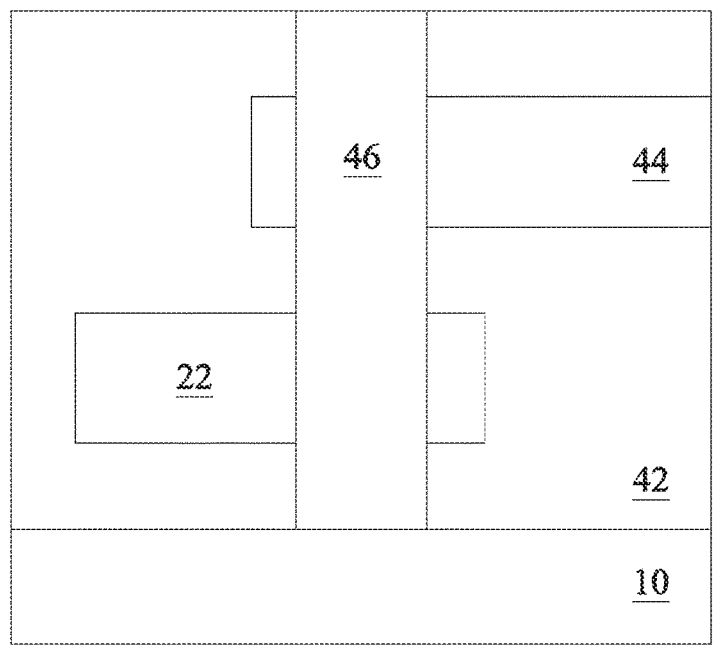
Figure 4I:
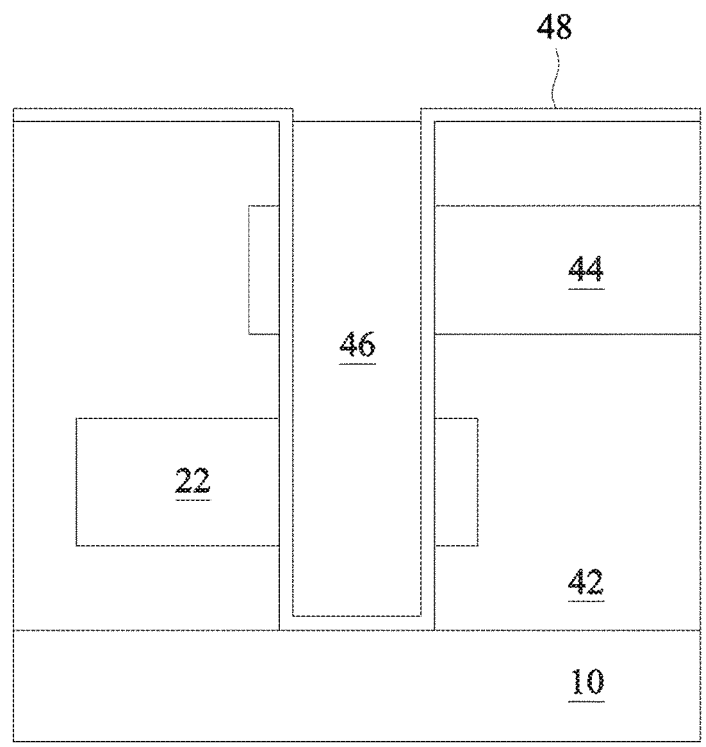
Figure 4J:
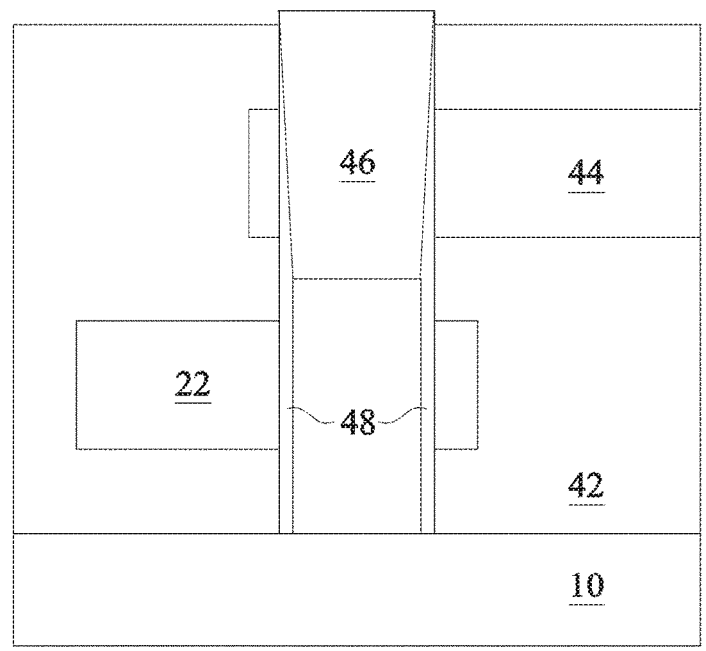
Figure 4K:
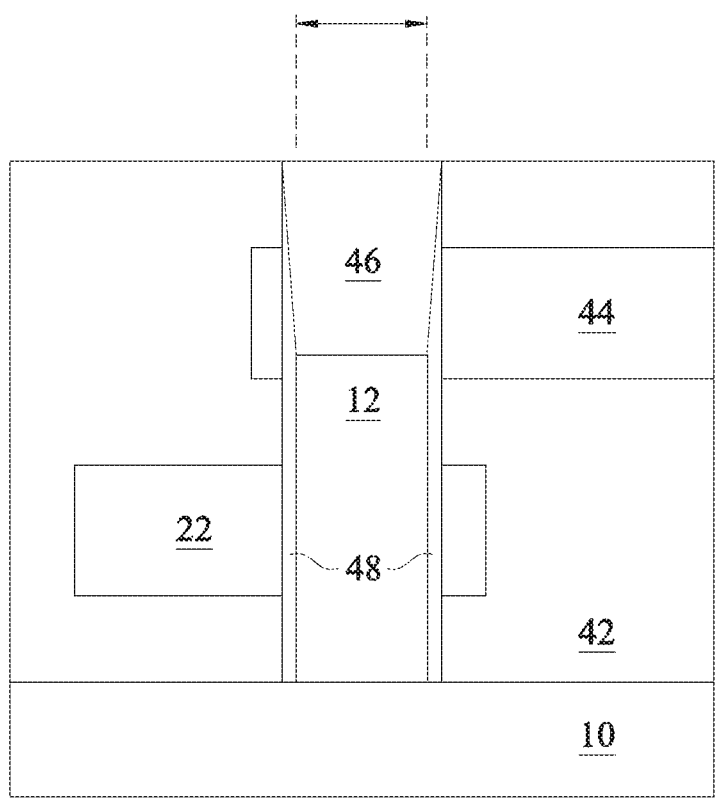
Figure 4L:
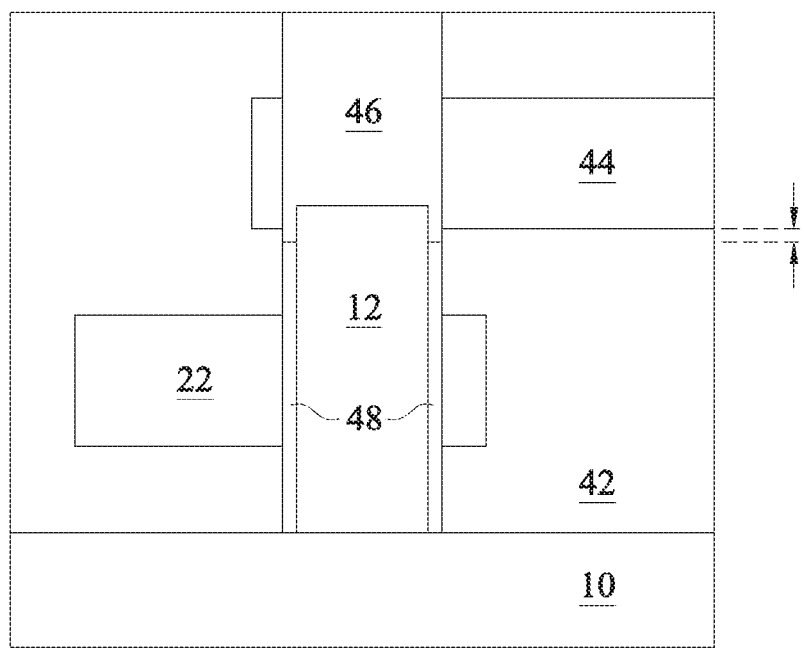
Figure 4M:
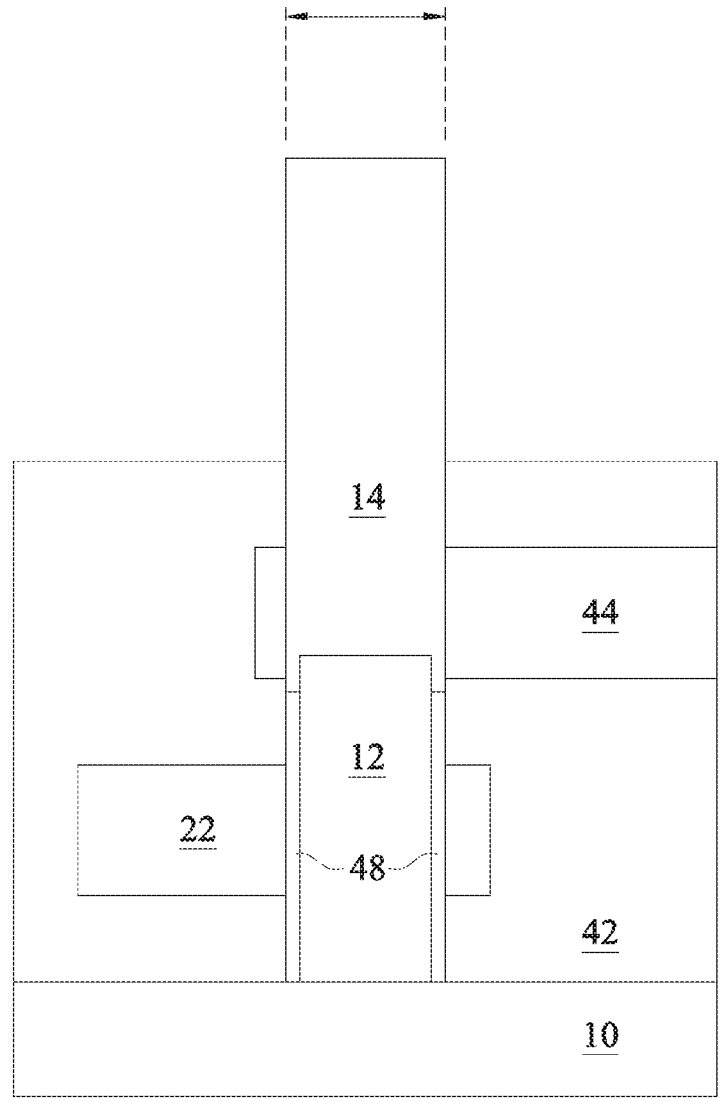
Figure 4N:
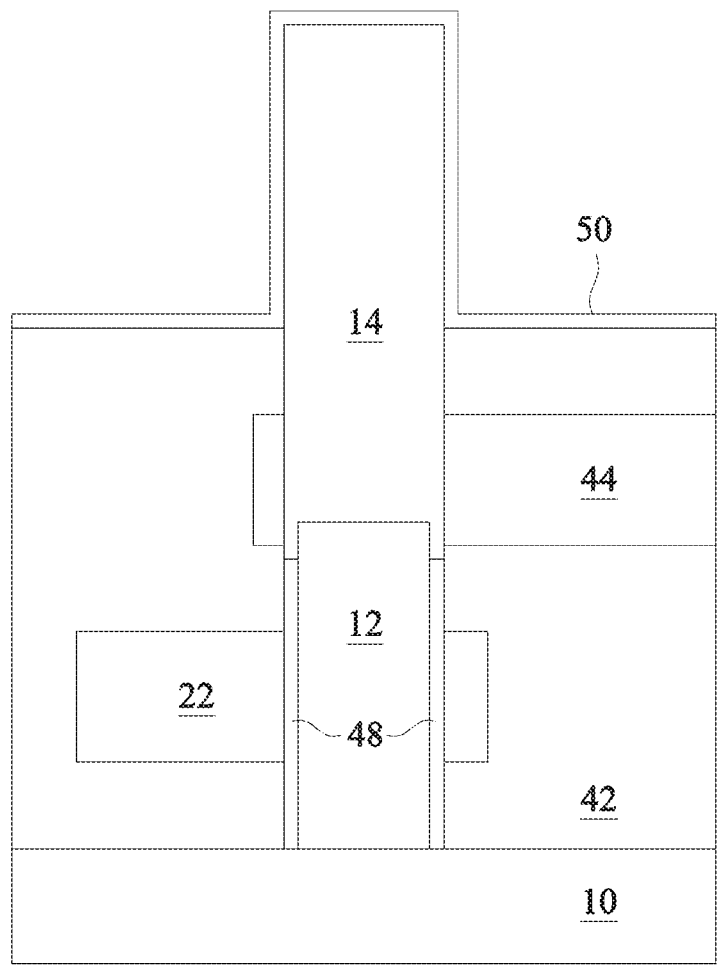
Figure 4O:
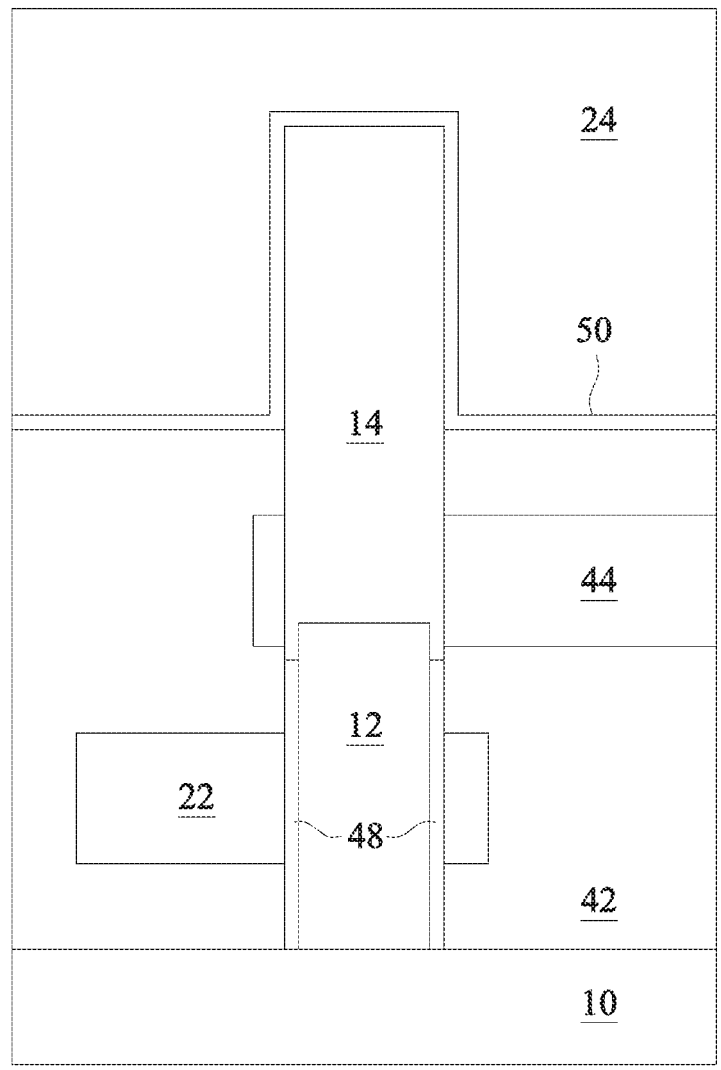
Figure 4P:
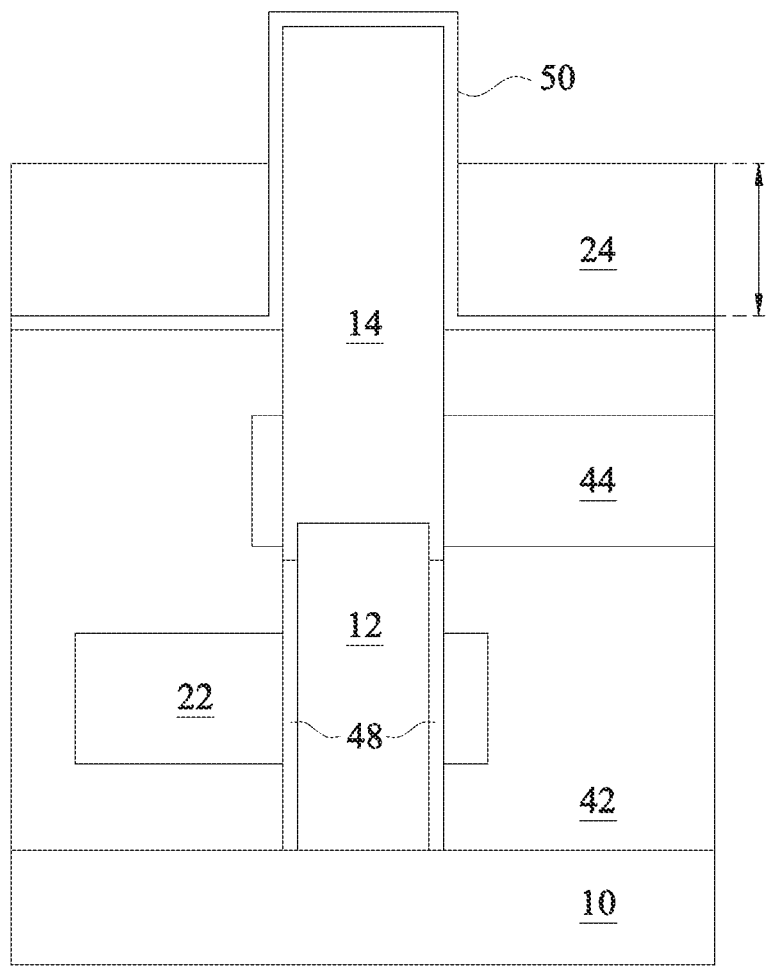
Figure 4Q:
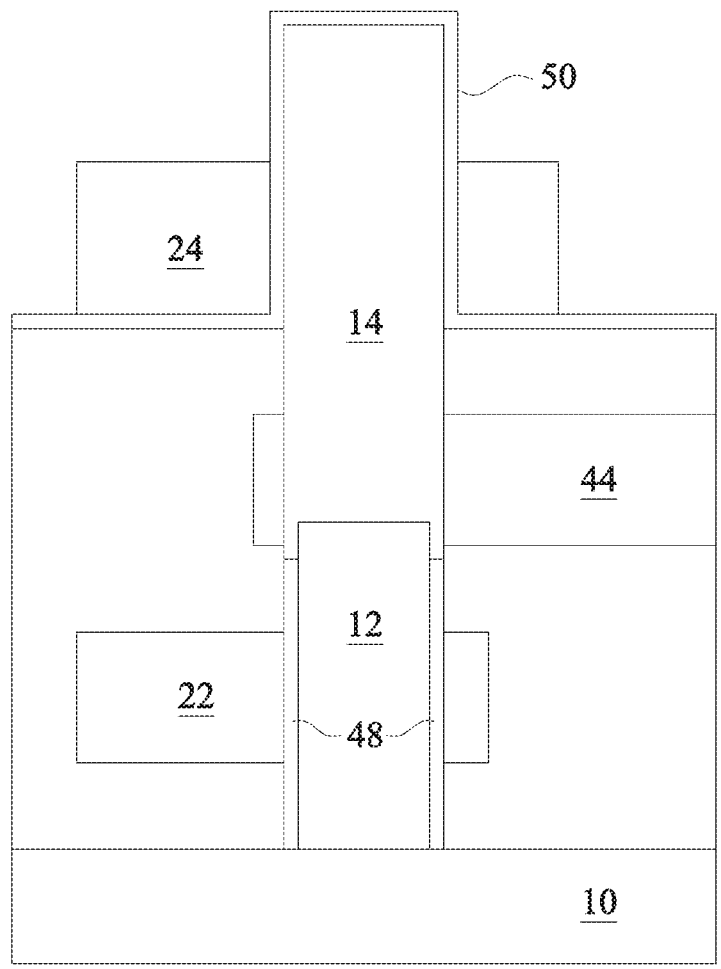
Figure 4R:
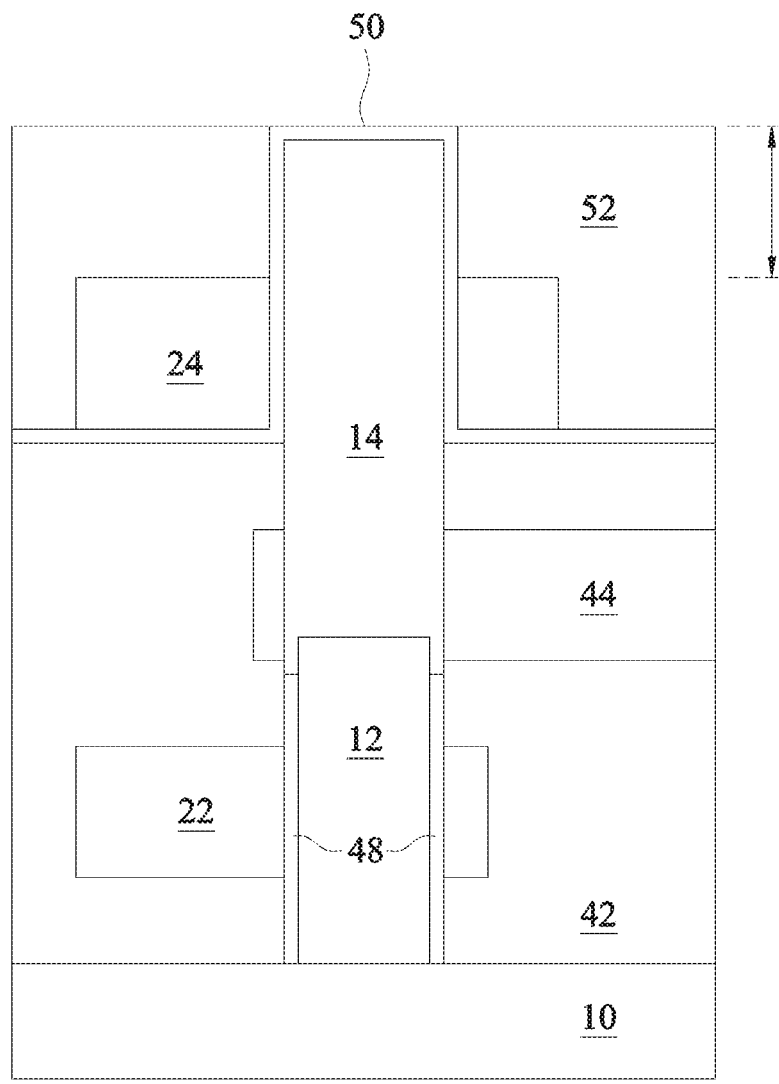
Figure 4S:
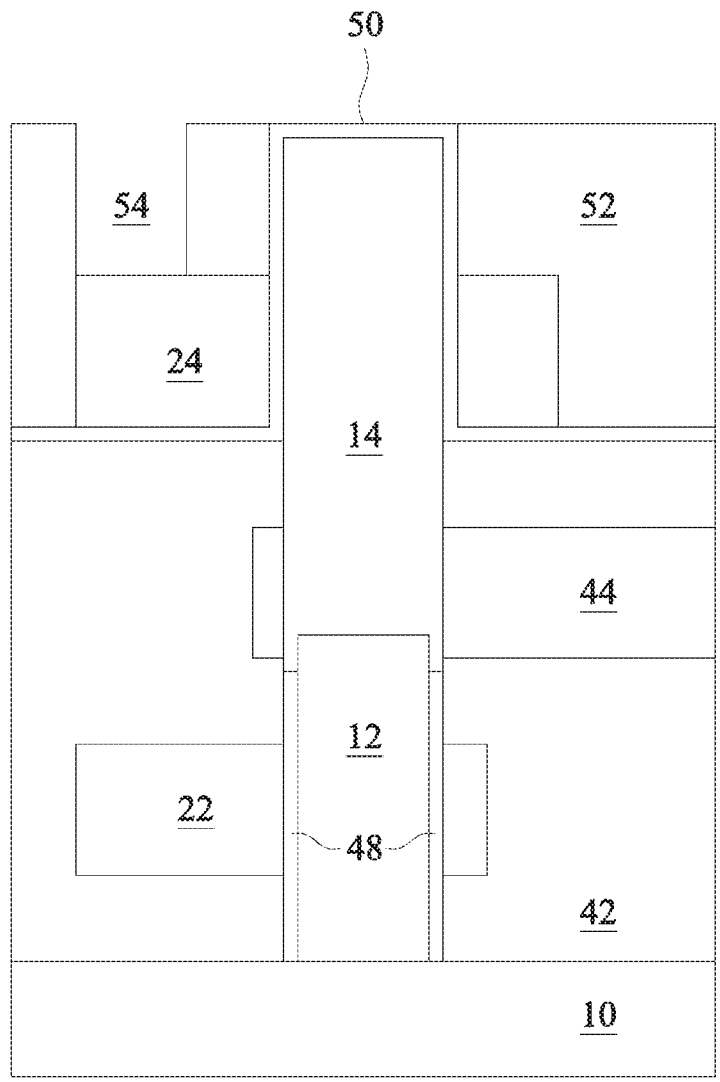
Figure 4T:
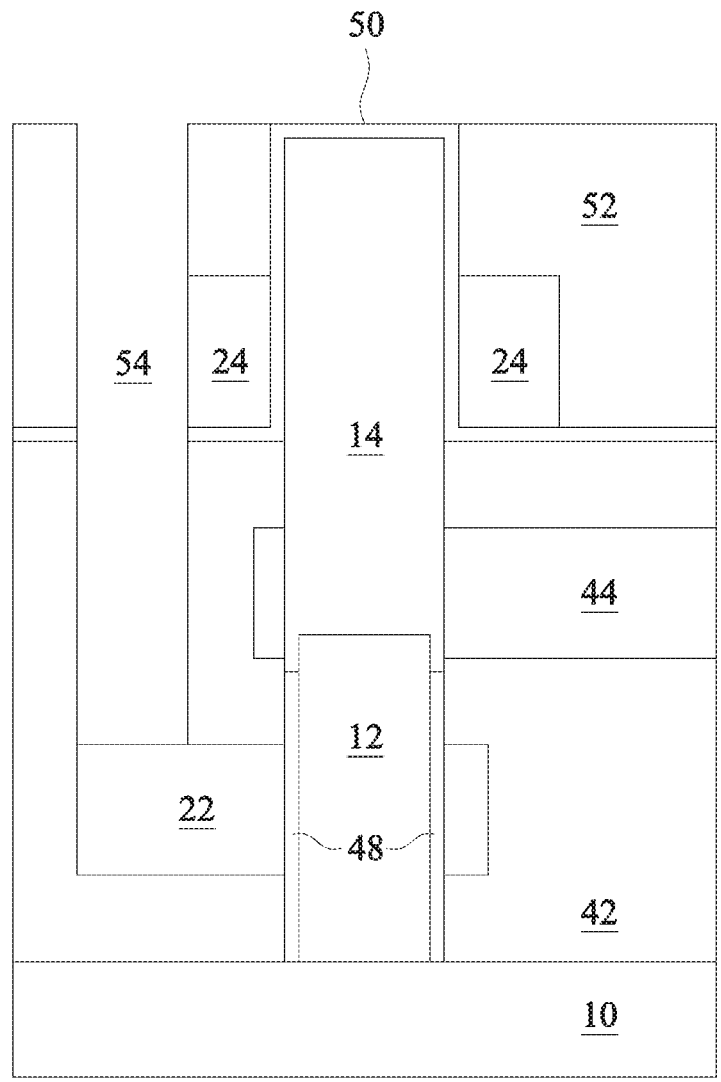
Figure 4U:
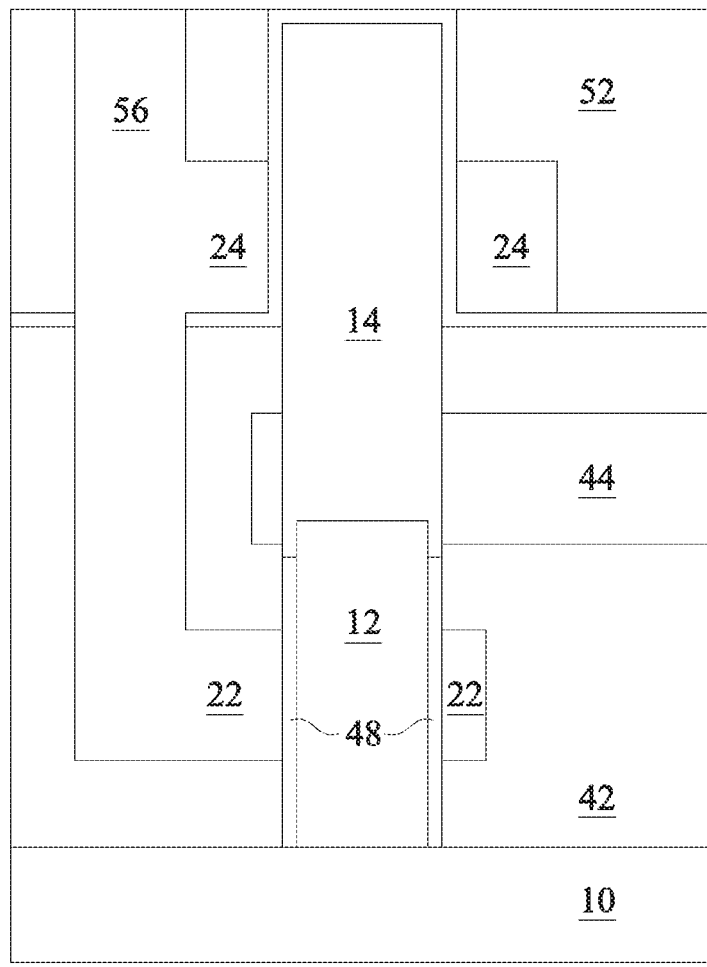
Figure 4V:
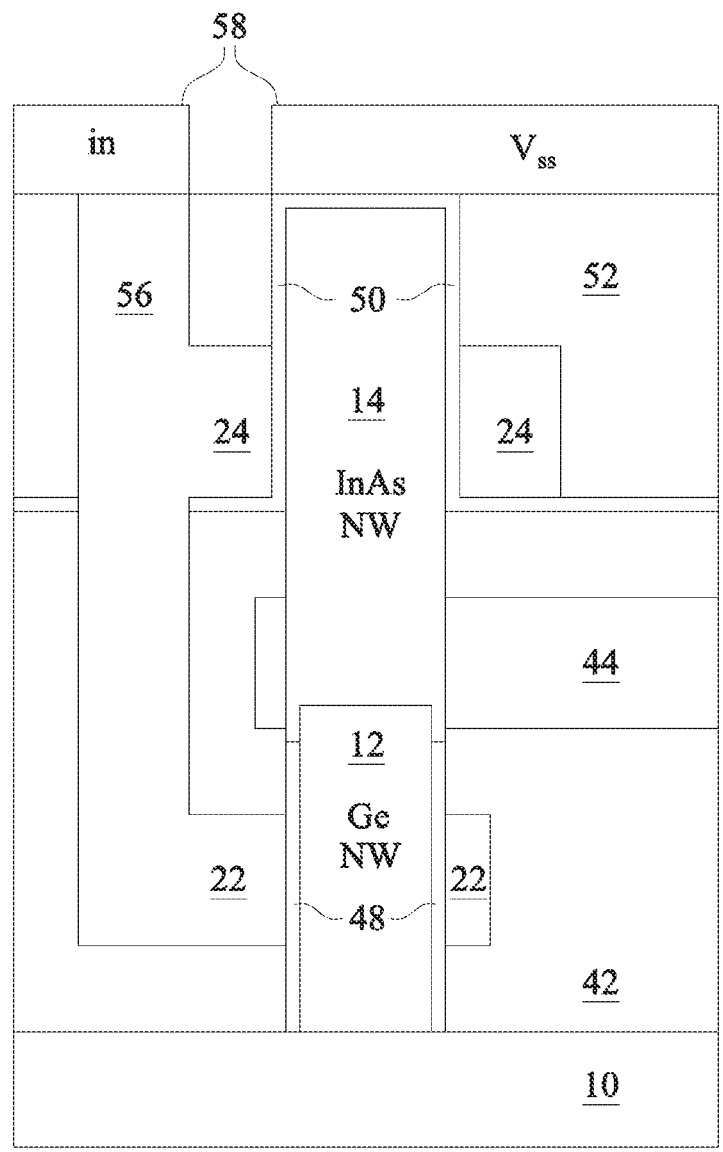

FIGS. 4A-4V show side views of the process steps for one process for forming the embodiment of FIG. 1. A bottom spacer layer 42 is deposited on substrate 10. Substrate 10 may be formed of one of many crystalline semiconductive materials, such as crystalline silicon. Substrate 10 is doped to provide conductivity. Spacer layer 42 may be SiO2 or SiN$_x$ or similar material or combination thereof. Gate contact metal 22 is then deposited on spacer layer 42. Gate contact metal 22 may be polycrystalline Si, TiN, TaN, W, Al, or similar material or combination thereof. This provides the structure of FIG. 4A. Gate contact metal 22 is then patterned using standard lithographic and etching techniques to provide the structure of FIG. 4B.

Next a dielectric fill layer is added to the exposed portions of spacer layer 42 using chemical vapor deposition or similar techniques. The combined layer 42 is then planarized using conventional chemical-mechanical polishing (CMP) techniques to provide the structure of FIG. 4C. The dielectric fill layer may be SiO2 or SiNx or similar material or combination thereof. An additional dielectric fill layer is then added to combined layer 42 to provide the structure of FIG. 4D. This dielectric fill is deposited and planarized using standard deposition and CMP techniques, and may comprise SiO2 or SiNx or similar material or combination thereof. The steps for forming this dielectric fill may be deposition then CMP or deposition, followed by CMP, followed by a further deposition.

FIG. 4E shows the next step where drain contact metal 44 is deposited using standard metal deposition techniques. Drain contact metal 44 may be Ti, TiN, TaN, W, Al, or similar material or combination thereof. Drain contact metal 44 is then patterned using standard lithography and etch techniques as shown in FIG. 4F. Combined layer 42 is then expanded as shown in FIG. 4G using standard deposition and CMP techniques to form the bottom spacer for the second level nanowire transistor 30 (FIG. 1). The steps for forming this dielectric fill may be deposition then CMP or deposition, followed by CMP, followed by a further deposition. The dielectric fill layer may be SiO2 or SiNx or similar material or combination thereof.

An opening 46 is then etched through dielectric layer 42, drain contact metal 44 and gate contact metal 22 to substrate 10 as shown in FIG. 4H. Opening 46 may be etched using reactive ion etching or dry etching using $SF_6$, $SiCl_4$, C4F8, CH4, H2, Ar or other known etch gases or combinations thereof. A gate dielectric layer 48 is then deposited using standard conformal deposition techniques as shown in FIG. 4I. Gate dielectric layer 48 can be $SiO_2$, $HfO_2$, Al2O3, ZrO2 or similar material or combination thereof. Gate dielectric 48 may comprise a high-K dielectric material. The dielectric thickness can be 1-10 nm. Gate dielectric layer 48 is then etched using an anisotropic etch to result in the configuration shown in FIG. 4J. The anisotropic etch process may be reactive ion etching or dry etching using SF6, SiCl4, C4F8, CH4, H2, Ar or other known etch gases or combination thereof.

The first nanowire 12 is then deposited using a selective epitaxial technique using the silicon substrate as a nucleation site, such as metal-organic chemical vapor deposition (MOCVD) as shown in FIG. 4K. In one embodiment, nanowire 12 comprises crystalline germanium. An additional etching of gate dielectric layer 48 is then performed until the top of gate dielectric layer 48 is approximately 5-15 nanometers below the top of nanowire 12 as shown in FIG. 4L. The etch process may be reactive ion etching or dry etching using SF6, SiCl4, C4F8, CH4, H2, Ar or other known etch gases or combination thereof or wet etch using HF, HCl or similar chemical or combination thereof.

The second nanowire channel region 14 is then deposited using a selective epitaxial technique with the first nanowire region 12 serving as a nucleation site, such as MOCVD, as shown in FIG. 4M. In a one embodiment, second nanowire 14 comprises crystalline Indium Arsenide (a group III-V compound semiconductor).

Next an optional dummy gate dielectric 50 is formed using atomic layer deposition (ALD) or CVD as shown in FIG. 4N. Dummy gate dielectric can be SiO2, SiN, HfO2, ZrO2, Al2O3 or similar material or combination thereof. The thickness of dummy gate dielectric can be 1-10 nm. Next, gate metal 24 is deposited as shown in FIG. 4O. Gate metal 24 may be poly-Si, TiN, TaN, W, Al, or similar material or combination thereof. Gate metal 24 is then etched back to a thickness as shown in FIG. 4P by etching or a combination of etching with CMP. The etch process may be reactive ion etch using SF6, SiCl4, C4F8, CH4, H2 or other known etch gases or combination thereof or wet etch using HF, HCl, TMAH or similar chemical or combination thereof. Gate metal 24 is then patterned using standard lithographic and etching techniques to the form shown in FIG. 4Q. A dielectric layer 52 is then formed using standard deposition and CMP techniques as shown in FIG. 4R. Dielectric layer 52 may be SiO2 or SiNx or similar material or combination thereof.

Next a gate contact hole 54 is formed using standard lithographic and etching techniques as shown in FIG. 4S and extended as shown in FIG. 4T. A two step process is used where a highly controllable etch is used to make the hole of FIG. 4Q and then a more aggressive etch that can etch gate metal layer 22 and 24 is used. The etch processes may be reactive ion etch or dry etch using SF6, SiCl4, C4F8, CH4, H2, Ar or other known etch gases or combination thereof.

A gate metal contact layer 56 is then deposited using standard selective deposition techniques as shown in FIG. 4U. The gate contact layer provides conductive contact to gate layers 22 and 24. Gate contact layer 56 may be TiN, TaN, W, Al, or similar material or combination thereof. Dummy gate material 50 is removed from the top of upper nanowire channel 14 using standard etch processes. The etch process may be reactive ion etch using SF6, SiCl4, C4F8, CH4, H2 or other known etch gases or combination thereof or wet etch using HF, HCl, TMAH or similar chemical or combination thereof.

Metal contacts 58 are then deposited and patterned using standard deposition and etching techniques to provide contacts to the gate (in), the source of upper transistor 30 (Vss), output contact to 44 (34, out FIG. 1), and to the substrate (18, Vdd FIG. 1) as shown in FIG. 4V. By controlling the doping of germanium nanowire 12 and the relative concentrations of indium and arsenic in nanowire 14, an inverter is formed with n-channel transistor 30 and p-channel transistor 20, as shown in FIG. 1. Using different doping and/or relative concentrations, transistor 30 may be p-channel and transistor 20 may be n-channel.

Figure 5A:
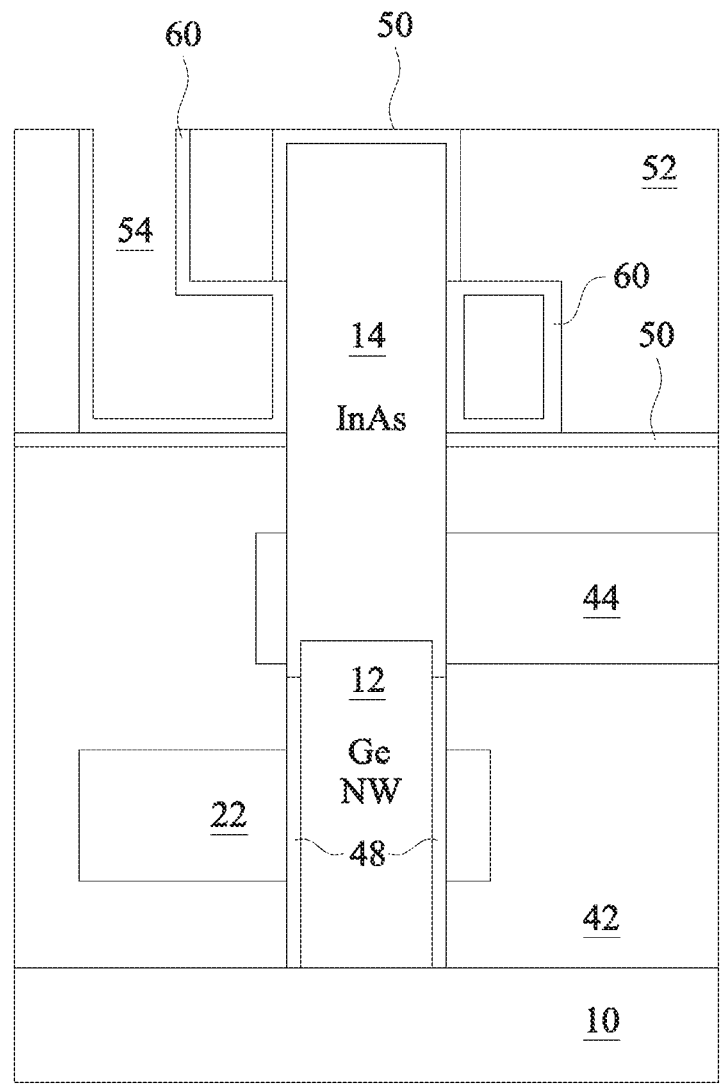
FIGS. 5A-5E are side view diagrams show alternative processing steps for the process shown in FIGS. 4A-4V, which alternative steps comprise another embodiment of the present disclosure.

In an alternative embodiment, starting with the structure as shown in FIG. 4S, gate layer 24 and the portion of gate layer 50 between gate layer 24 and nanowire 14 are removed using an etch process. The etch process may be reactive ion etch using SF6, SiCl4, C4F8, CH4, H2 or other known etch gases or combination thereof or wet etch using HF, HCl, TMAH or similar chemical or combination thereof. A replacement gate dielectric 60 is formed using an atomic layer deposition (ALD) technique as shown in FIG. 5A. Gate dielectric 60 can be SiO2, HfO2, Al2O3, ZrO2 or similar material or combination thereof and may be a thickness of 1-10 nm. Gate dielectric 60 comprises a high-K dielectric material.

Figure 5B:
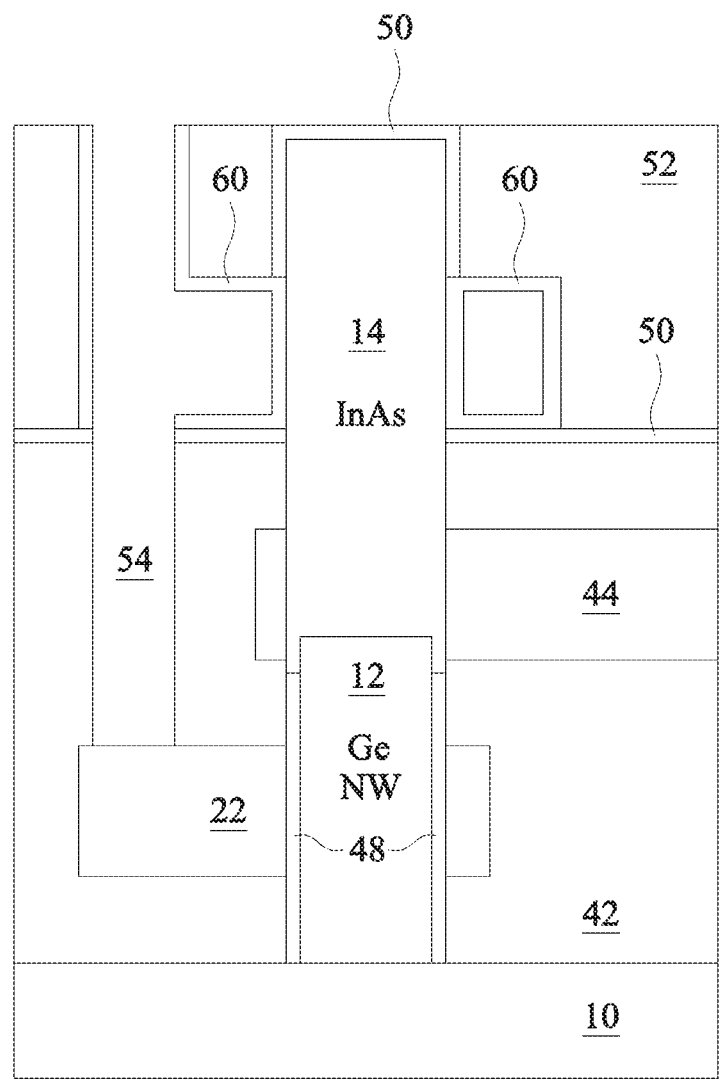
Figure 5C:
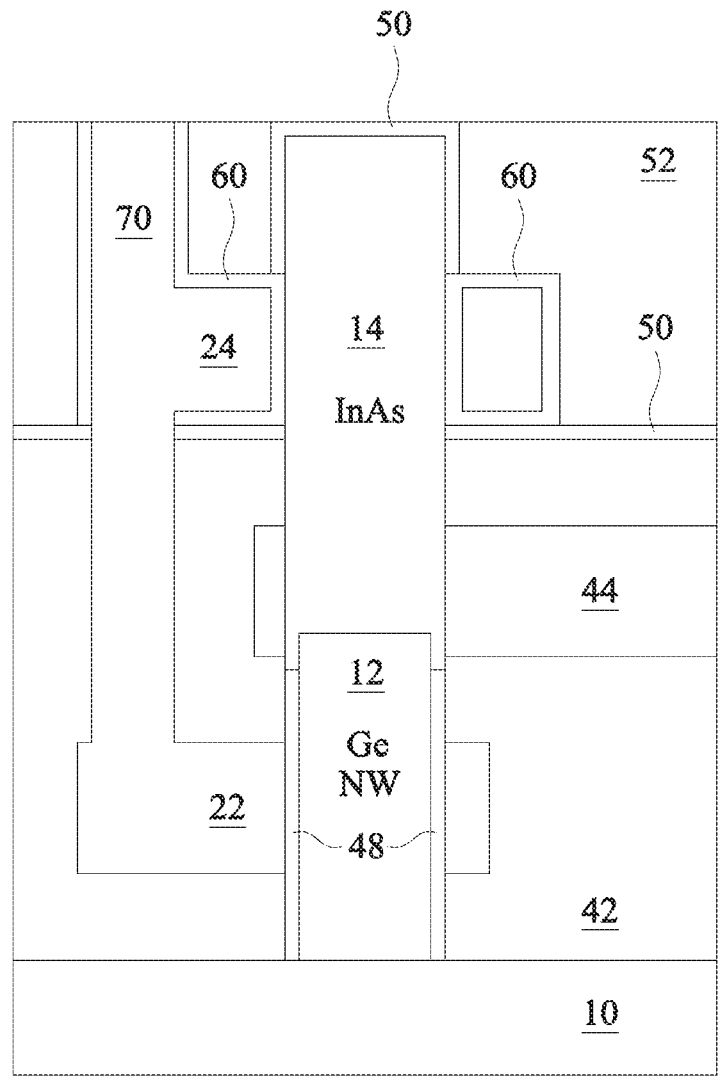
Figure 5D:
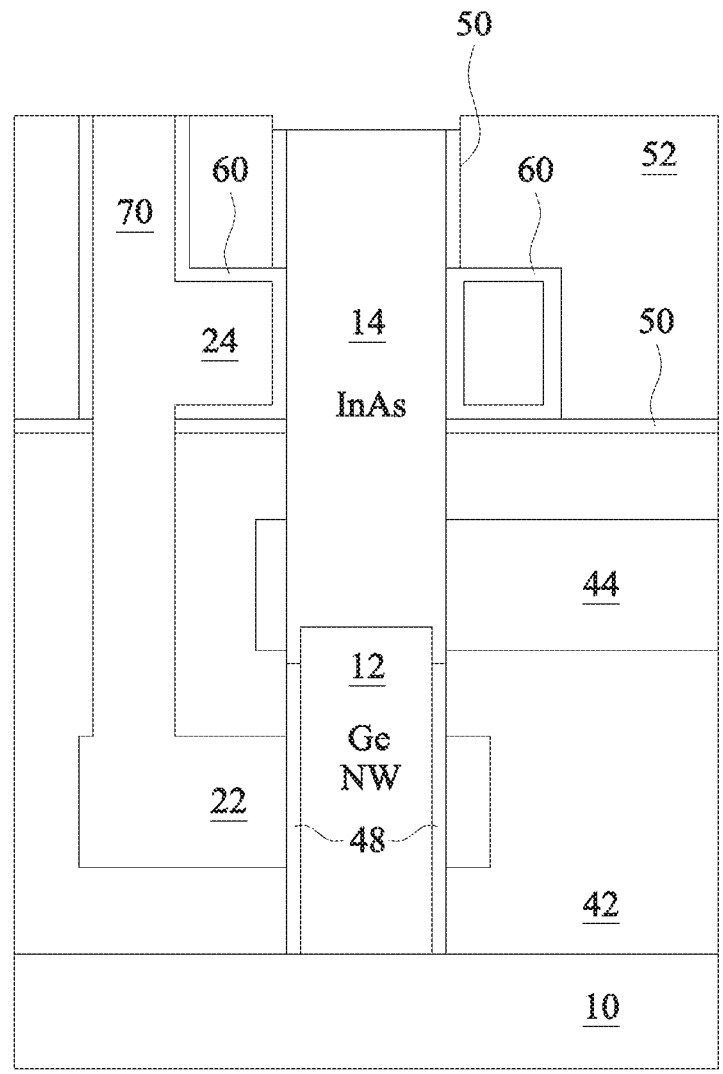

Opening 54 is then extended to gate layer 22 using etching as shown in FIG. 5B. The etching process may be reactive ion etching or dry etching using SF6, SiCl4, C4F8, CH4, H2, Ar or other known etch gases or combination thereof. Opening 54 is then filled using, for example, selective chemical vapor deposition to provide contact 70 and reformed gate layer 24 as shown in FIG. 5C. Then, the portion of dummy gate layer 50 on top of nanowire 14 is removed using etching as shown in FIG. 5D. The etch process may be reactive ion etch using SF6, SiCl4, C4F8, CH4, H2 or other known etch gases or combination thereof or wet etch using HF, HCl, TMAH or similar chemical or combination thereof.

Figure 5E:
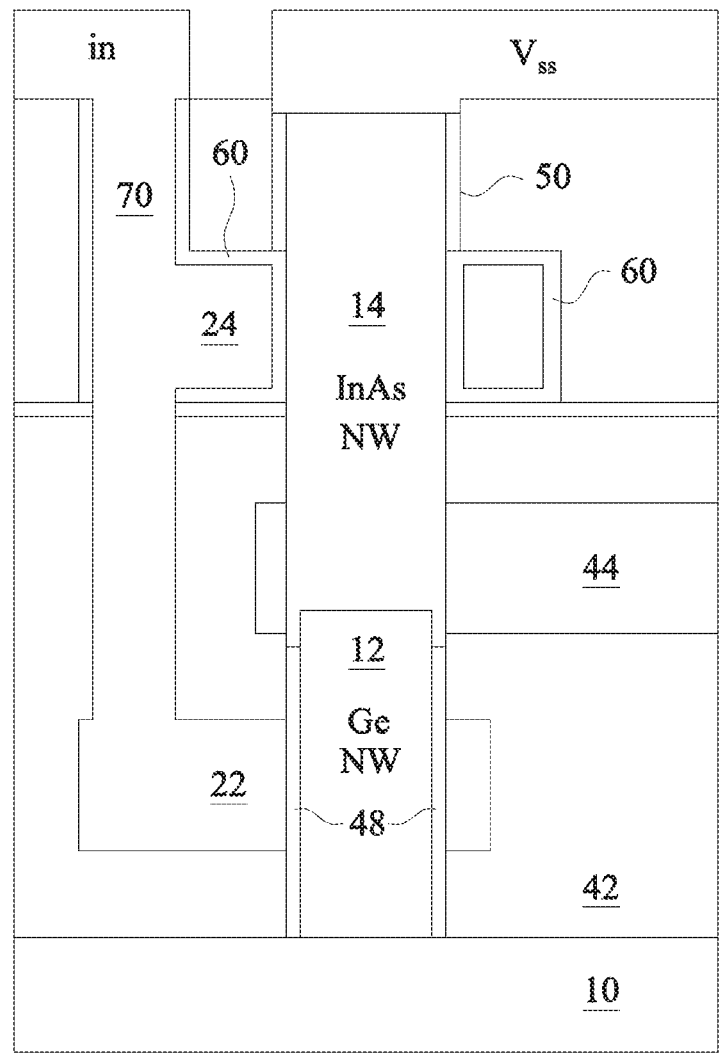

Metal contacts 58 are then deposited and patterned using standard deposition and etching techniques to provide contacts to the gate (in), the source of upper transistor 30 (Vss), output contact to 44 (34, out FIG. 1), and to the substrate (18, Vdd FIG. 1) as shown in FIG. 5E. By controlling the doping of germanium nanowire 12 and the relative concentrations of indium and arsenic in nanowire 14, an inverter is formed with n-channel transistor 30 and p-channel transistor 20, as shown in FIG. 1.

Figure 6A:
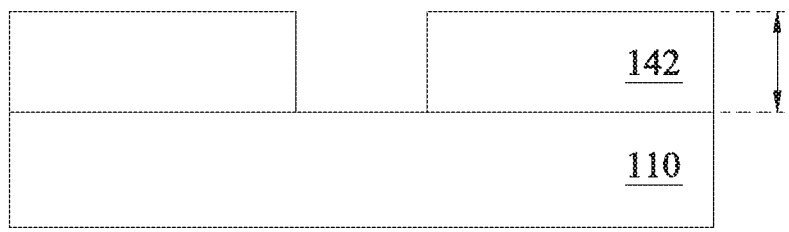
FIGS. 6A-6W are side view diagrams of a process, which comprises another embodiment of the present disclosure, for forming a pair of stacked, complementary transistors, which comprises yet another embodiment of the present disclosure.
Figure 6B:
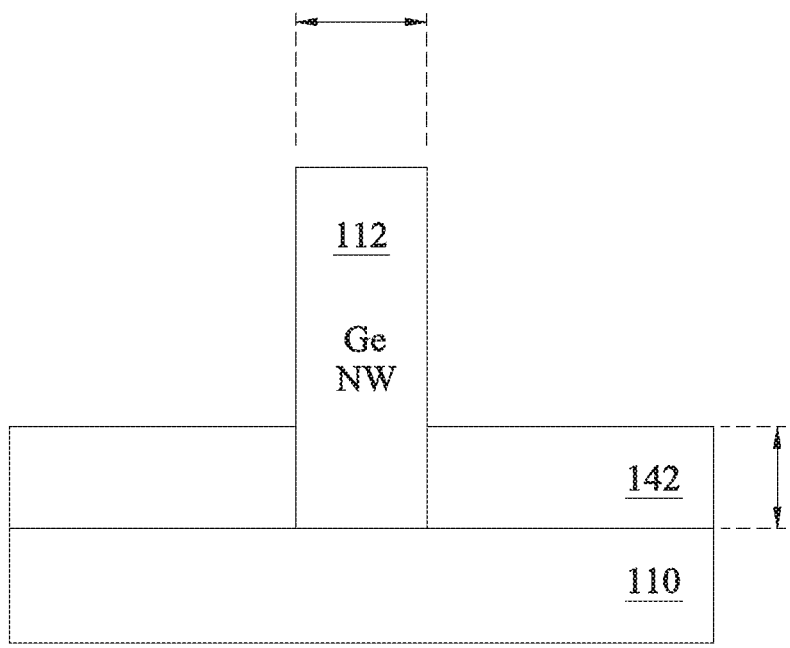
Figure 6C:
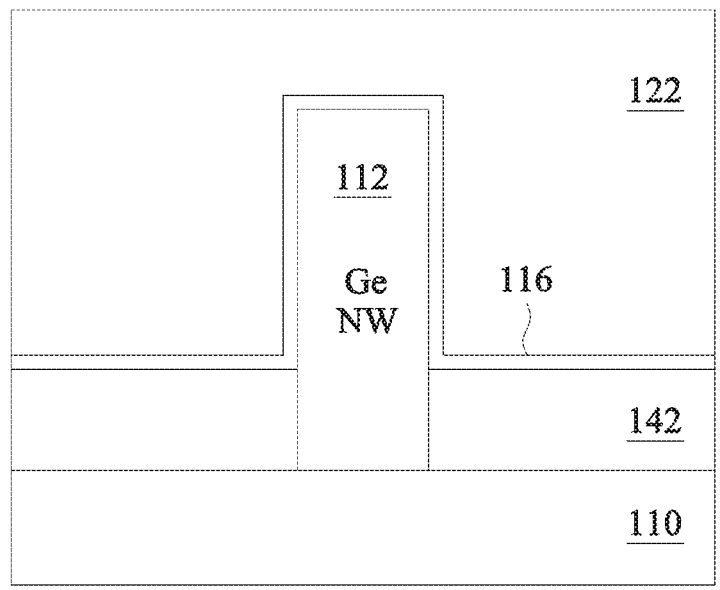
Figure 6D:
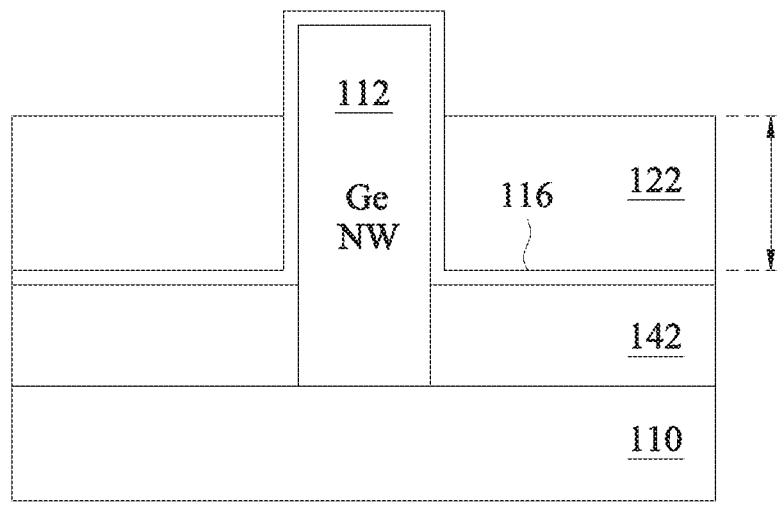
Figure 6E:
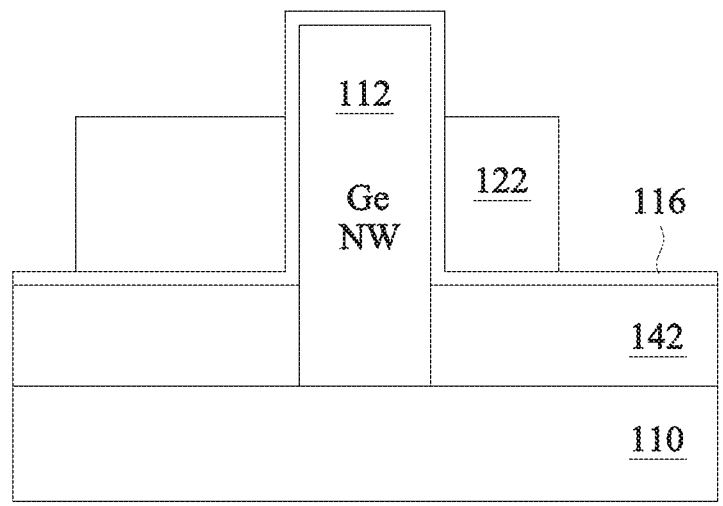
Figure 6F:
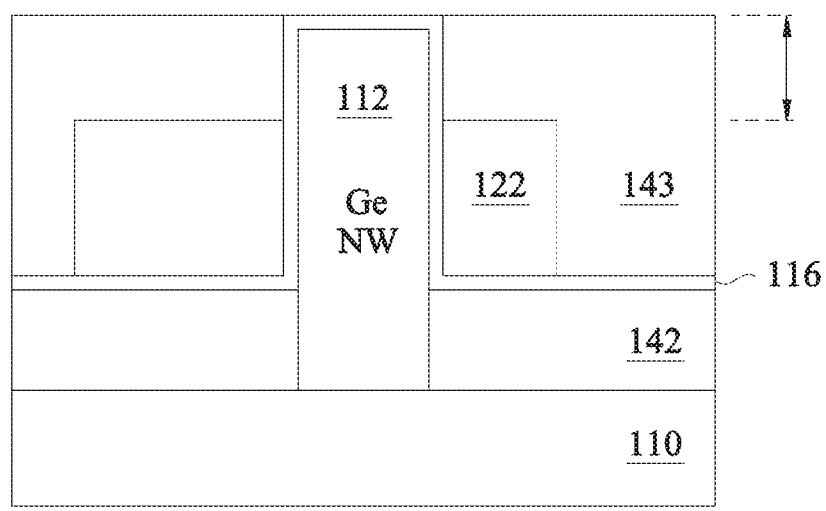
Figure 6G:
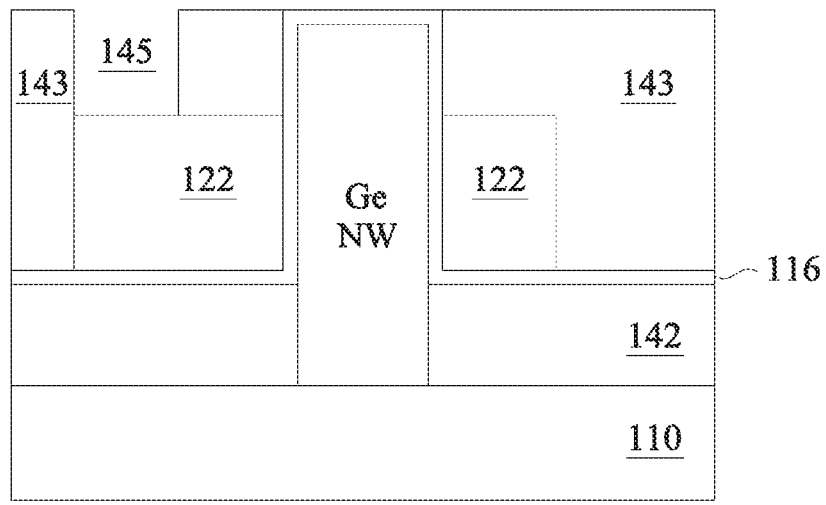
Figure 6H:
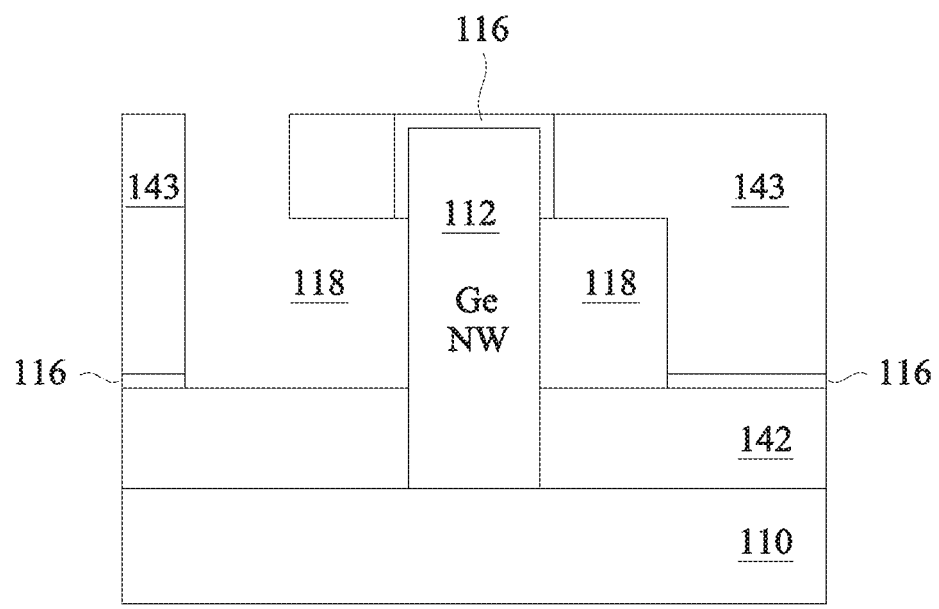
Figure 6I:
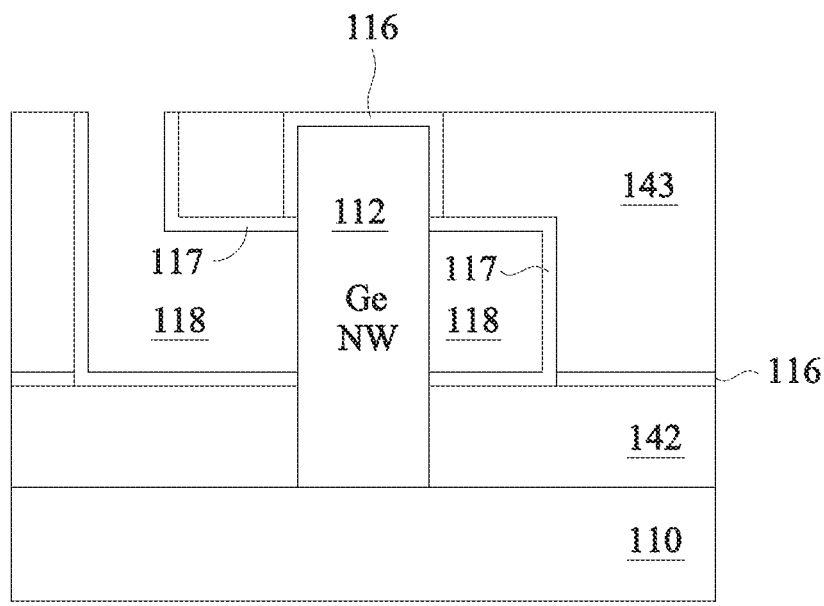
Figure 6J:
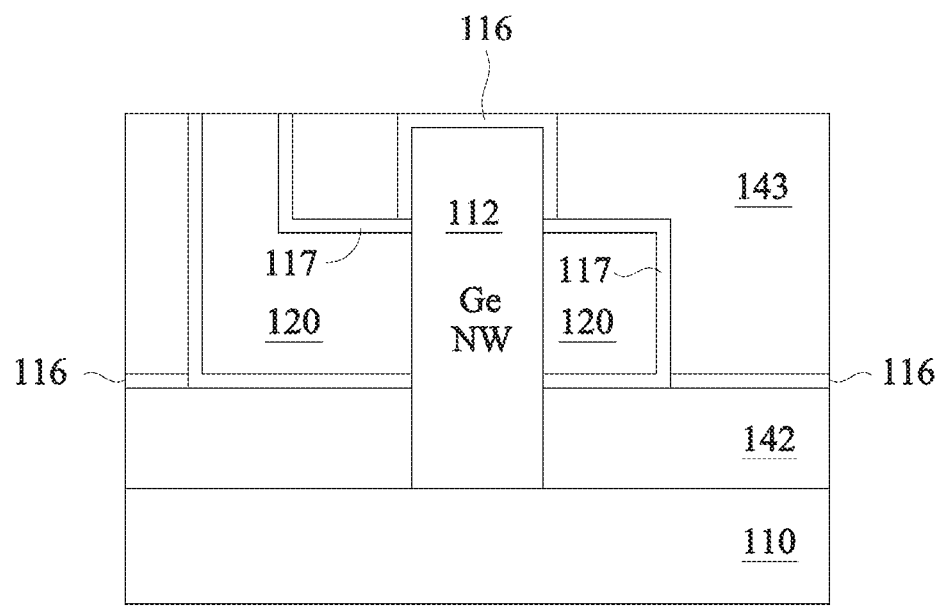
Figure 6K:
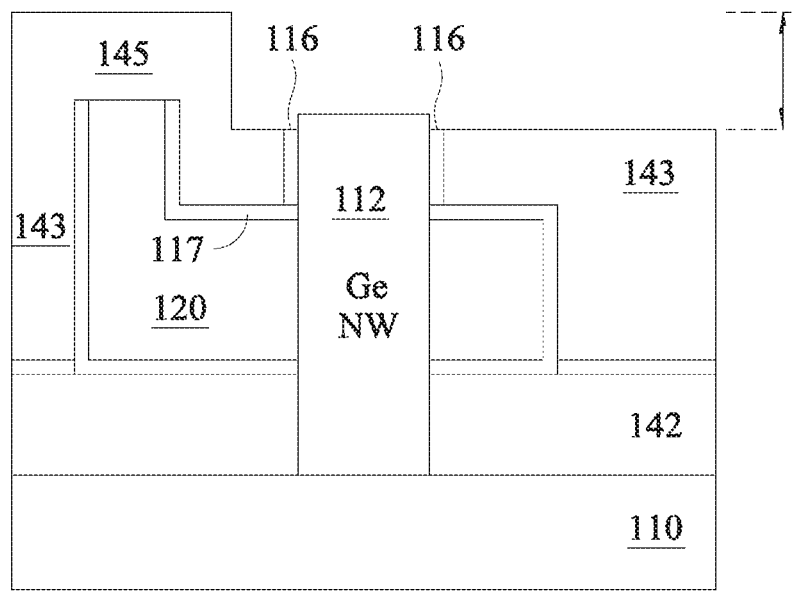
Figure 6L:
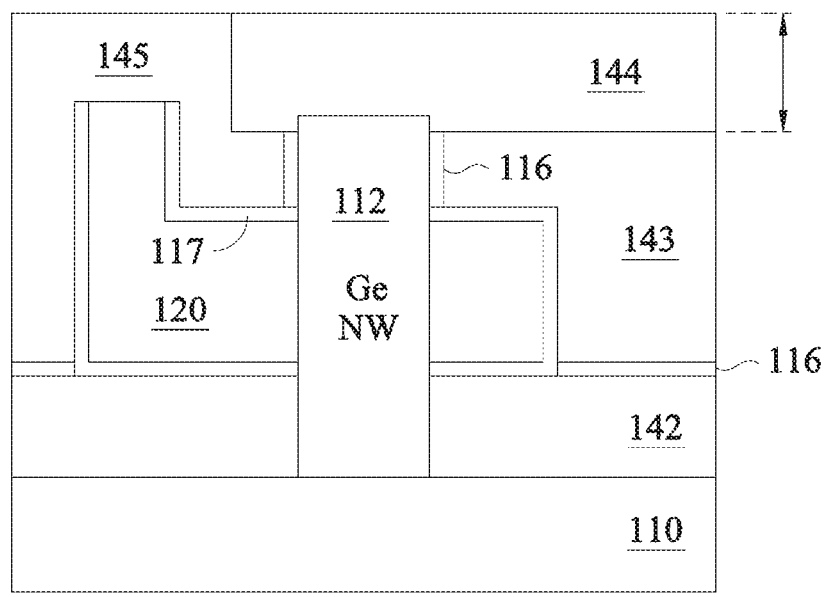
Figure 6M:
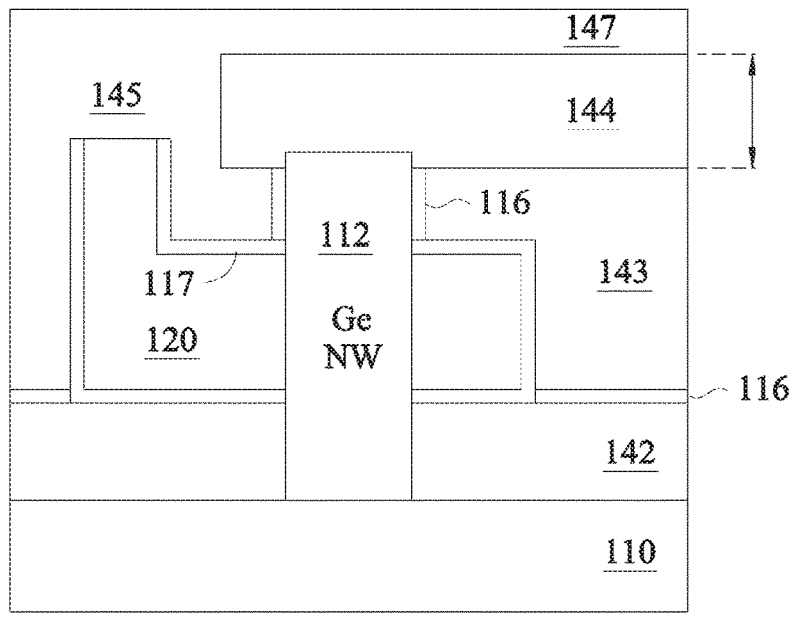
Figure 6N:
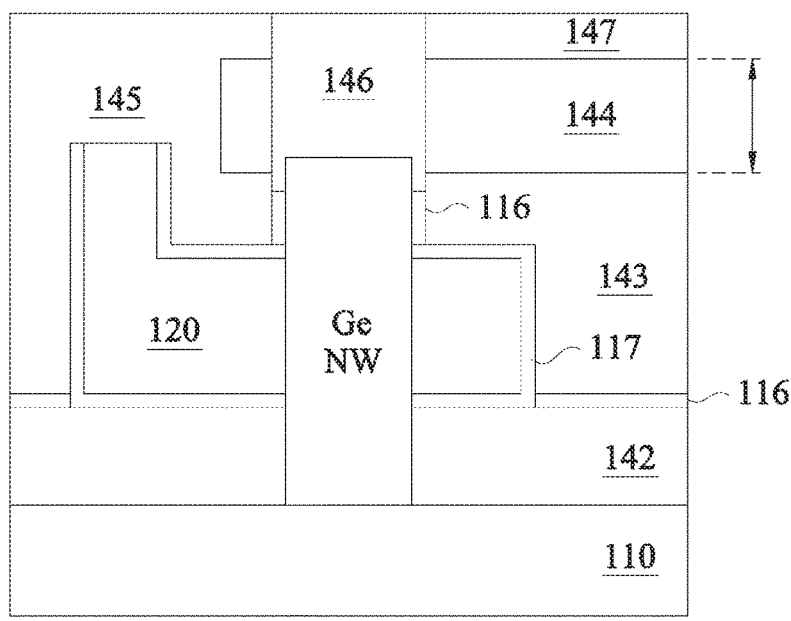
Figure 6O:
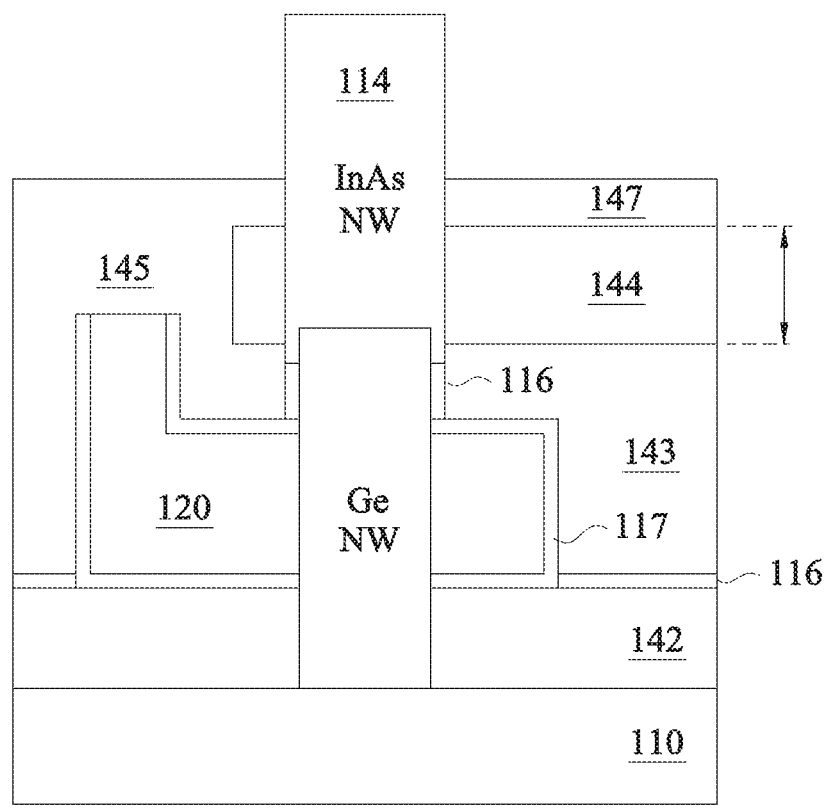
Figure 6P:
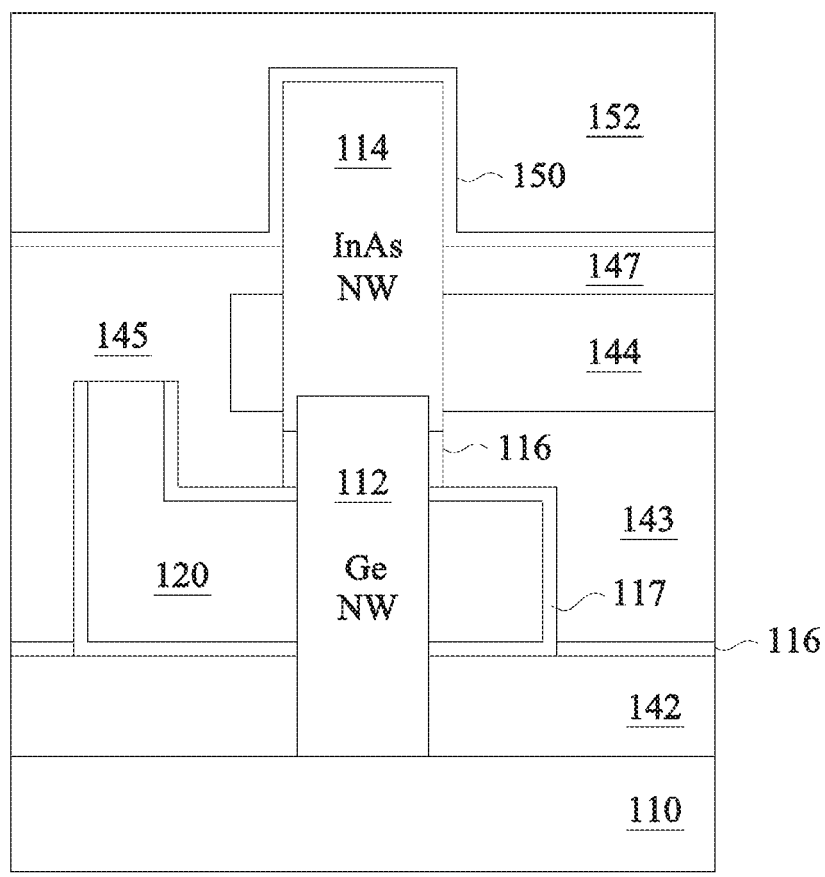
Figure 6Q:
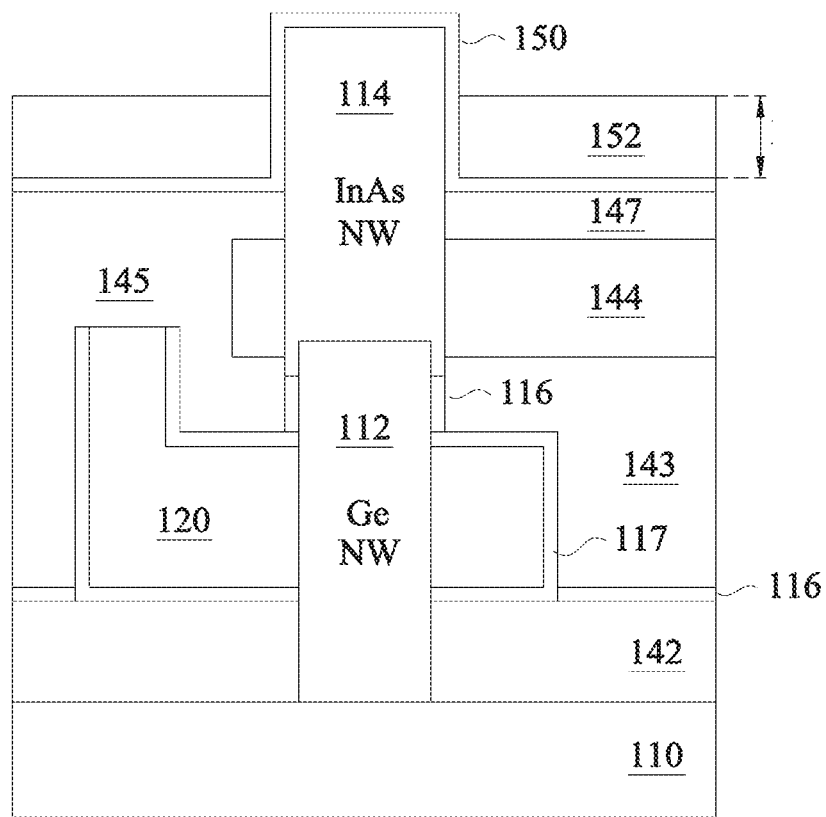
Figure 6R:
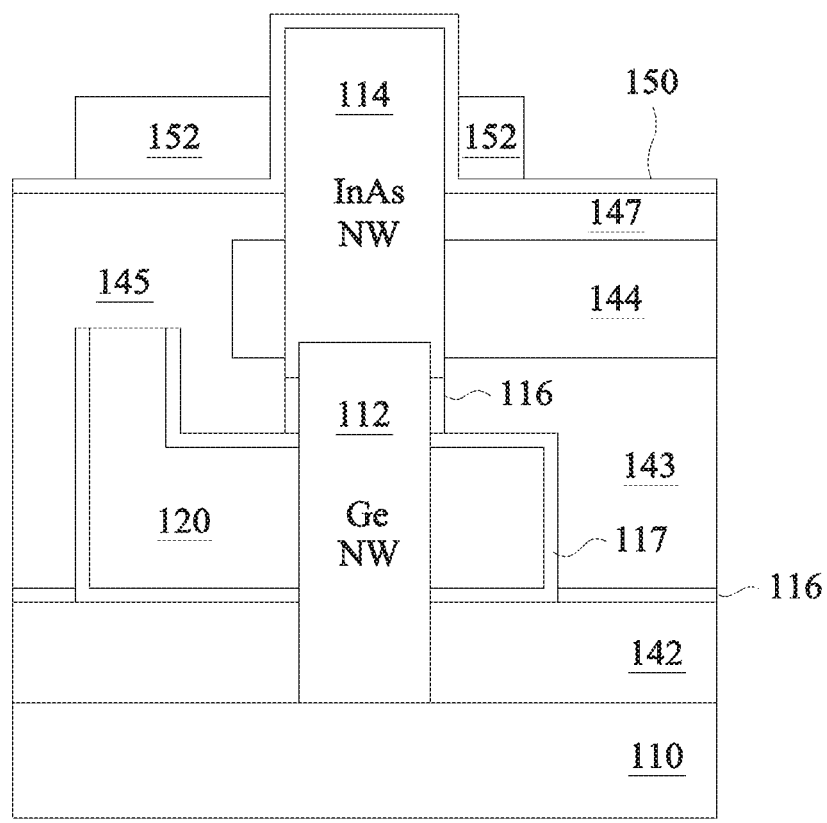
Figure 6S:
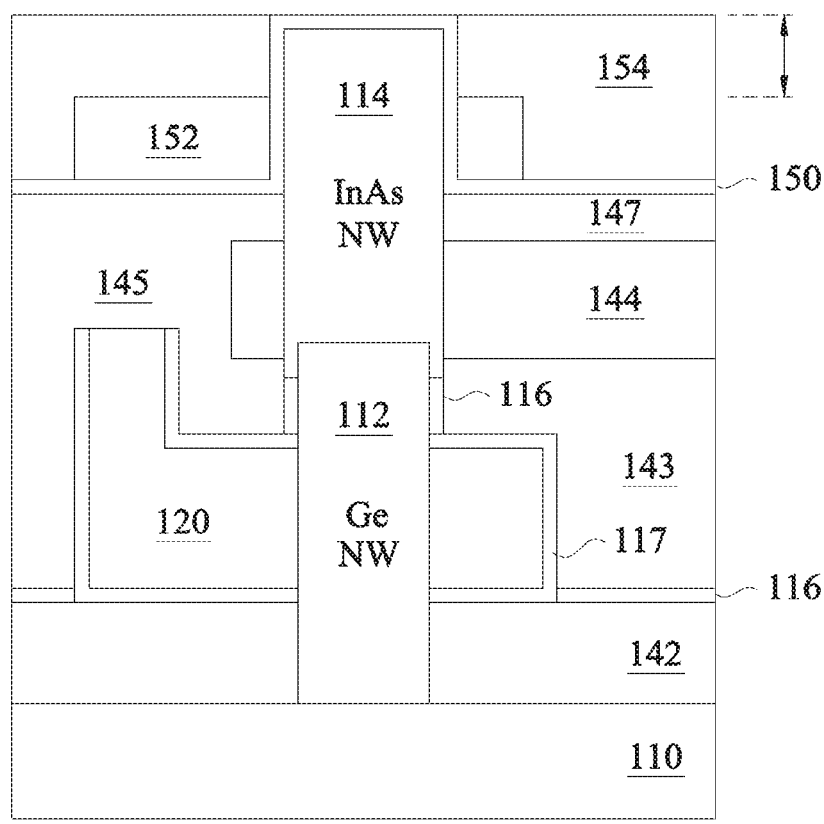
Figure 6T:
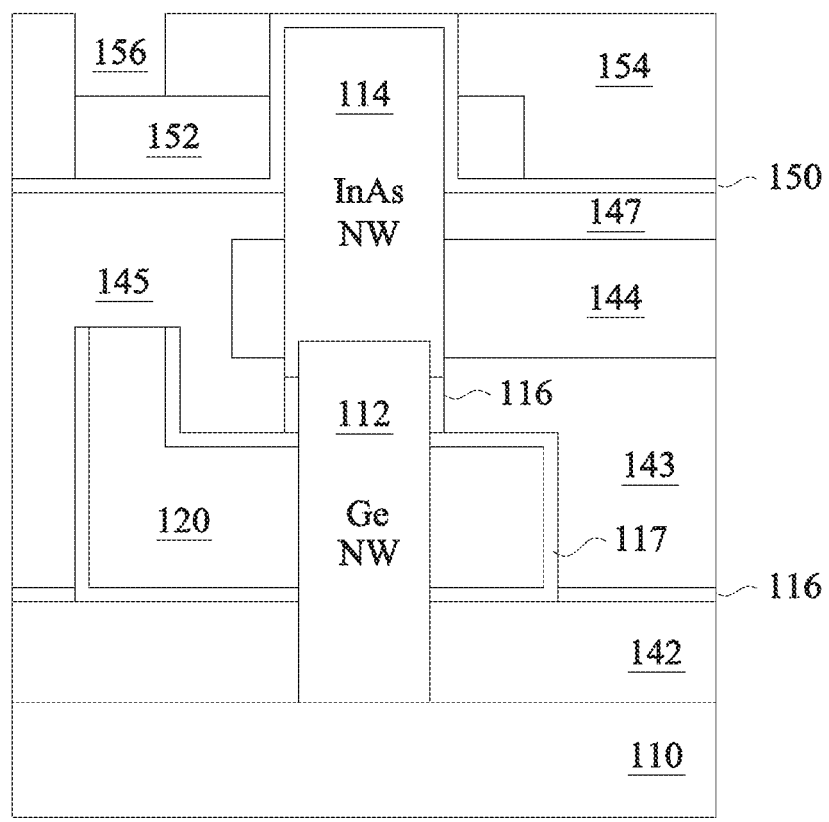
Figure 6U:
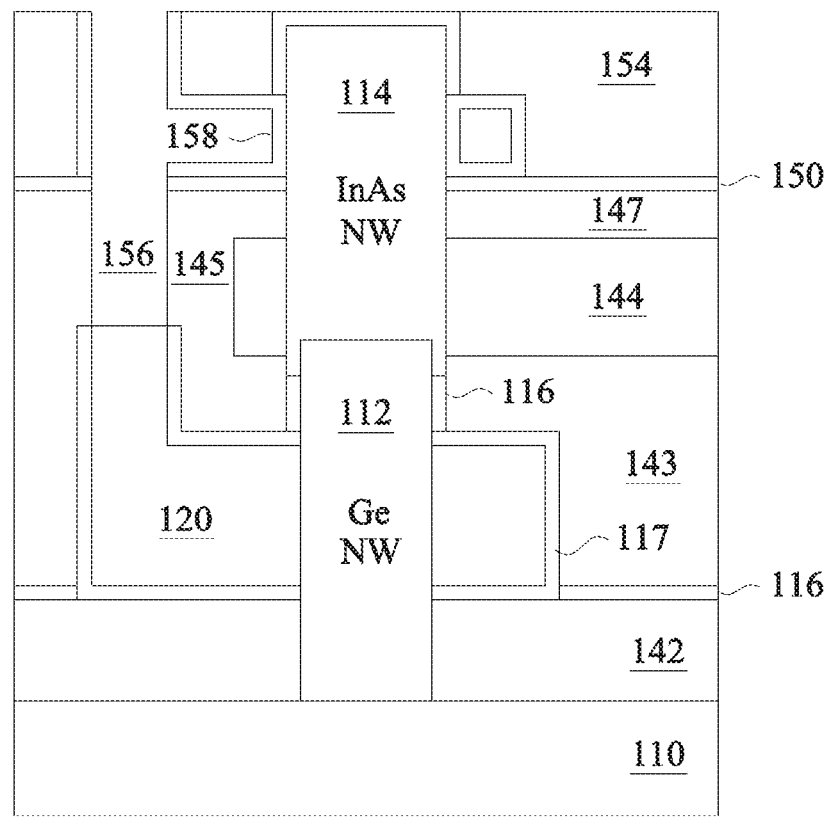
Figure 6V:
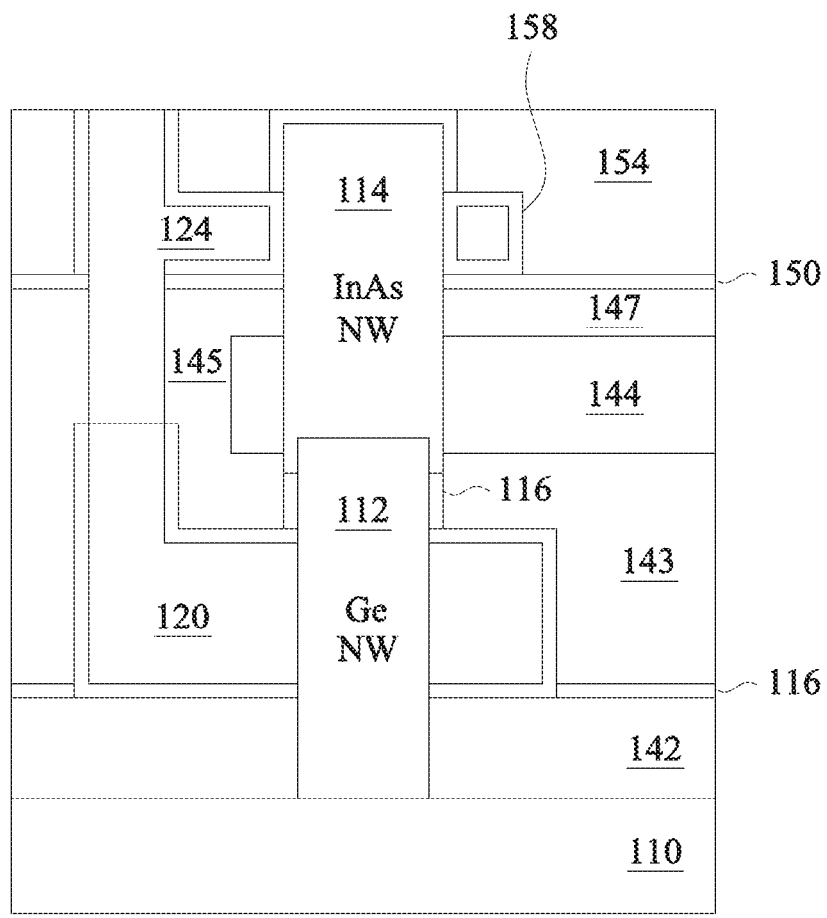
Figure 6W:
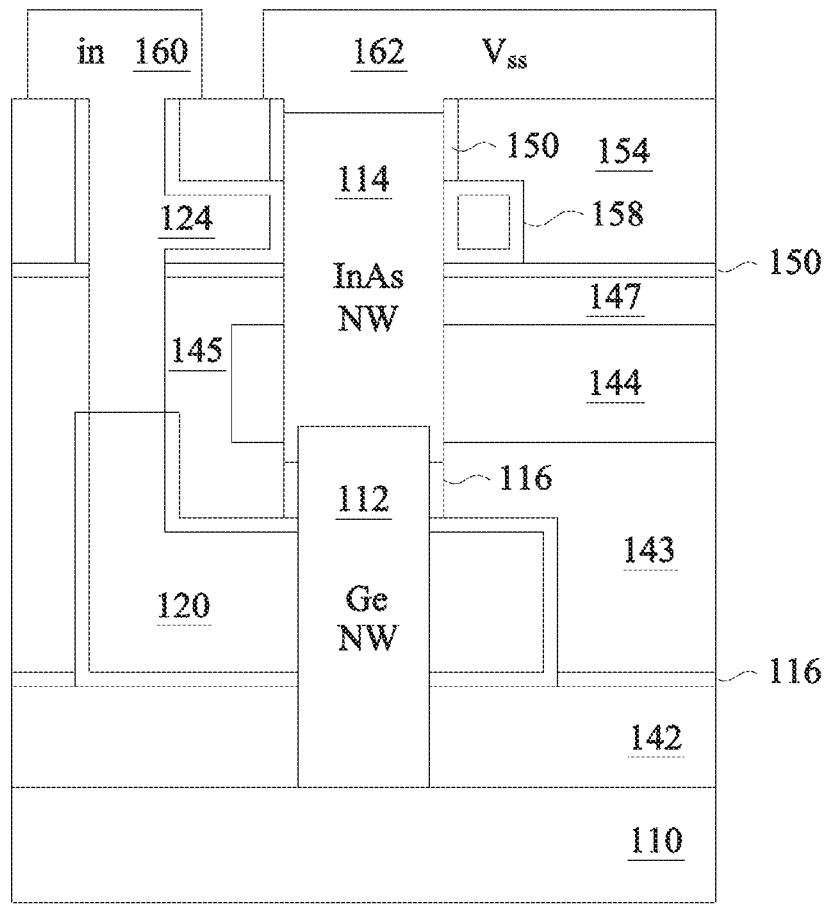

Another embodiment of the present disclosure is illustrated in FIGS. 6A-6W. In FIG. 6A, a dielectric layer 142 is formed and patterned on a crystalline silicon substrate 110. Substrate 110 may be Si, GaAs, InP, InAs or similar material or any combination thereof, doped with arbitrary profile n- or p-type ($1\times10^{16}$ to $5\times10^{20}$ $cm^{-3}$), or semi-insulating or any combination thereof. Dielectric layer may be SiO2 or SiNx or similar material or combination thereof.

Nanowire layer 112 is formed using an epitaxial technique, such as MOCVD as shown in FIG. 6B. Nanowire layer 112 may include crystalline germanium. A dummy gate layer 116 is formed on nanowire 112 and dielectric layer 142 followed by sacrificial gate layer 122 as shown in FIG. 6C. Sacrificial gate layer 122 is then etched back as shown in FIG. 6D using etching or a combination of etching and CMP. Sacrificial gate layer may comprise amorphous silicon, poly-silicon, SiO2, SiN or similar material or combination thereof. The etch process may be reactive ion etch using SF6, SiCl4, C4F8, CH4, H2 or other known etch gases or combination thereof or wet etch using HF, HCl, TMAH or similar chemical or combination thereof. Sacrificial gate layer 122 is then patterned as shown in FIG. 6E using standard photolithographic techniques.

Dielectric layer 143 is then deposited and etched back using standard deposition and CMP techniques to form dielectric layer 143 as shown in FIG. 6F. Dielectric layer 143 may be SiO2 or SiNx or similar material or combination thereof. Next, an opening 145 is formed using standard lithographic and etch techniques to expose sacrificial gate layer 122 as shown in FIG. 6G. Sacrificial gate 122 and the portion of dummy gate layer 116 adjacent to sacrificial gate 122 are then removed using an etch process to produce opening 118. This etching may be done using techniques such as reactive ion etch using SF6, SiCl4, C4F8, CH4, H2 or other known etch gases or combination thereof or wet etch using HF, HCl, TMAH or similar chemical or combination thereof. The resulting structure is show in FIG. 6H.

Gate dielectric 117 is then formed on the surfaces of opening 118 using ALD as shown in FIG. 6I. Gate dielectric 117 may comprise SiO2, HfO2, Al2O3, ZrO2 or similar material or combination thereof, and has a thickness can be 1-10 nm. Gate 120 is then formed by standard conformal deposition techniques filling opening 118 as shown in FIG. 6J. Gate 120 metal may be TiN, TaN, W, Al, or similar material or combination thereof.

A dielectric layer 145 is then deposited and patterned using standard lithographic techniques as shown in FIG. 6K. The steps to form dielectric layer 145 may include deposition followed by CMP, or may include deposition followed by CMP, which is followed by further deposition. Dielectric layer 145 may comprise SiO2 or SiNx or similar material or combination thereof. Shared contact layer 144 is deposited and patterned using standard lithographic and etch techniques, which may include CMP techniques, to form shared drain contact 144 as shown in FIG. 6L. Shared drain contact 144 may comprise TiN, TaN, W, Al, or similar material or combination thereof. Dielectric layer 147 is then deposited as shown in FIG. 6M. The steps to form dielectric layer 147 may include deposition followed by CMP, or may include deposition followed by CMP, which is followed by further deposition. Dielectric layer 147 may comprise SiO2 or SiNx or similar material or combination thereof.

Opening 146 through dielectric layer 147 and shared contact layer 144 is then formed using patterned etching as shown in FIG. 6N. As a part or the process for forming opening 146, dummy gate layer 116 will be removed from the top and partially from the sides of nanowire 112. The etch process may include reactive ion etch or dry etch using SF6, SiCl4, C4F8, CH4, H2, Ar or other known etch gases or combination thereof.

Nanowire 114 is then formed using, for example, MOCVD as shown in FIG. 6O. In a one embodiment, second nanowire 114 comprises Indium-Arsenic in a 3-5 crystalline configuration. Next a dummy gate dielectric 150 is formed using ALD or CVD as shown in FIG. 6P. Dummy gate dielectric 150 can be SiO2, SiN, HfO2, ZrO2, Al2O3 or similar material or combination thereof. The thickness of dummy gate dielectric can be 1-10 nm. Next, dummy gate layer 152 is deposited as shown in FIG. 6P. Dummy gate layer 152 may be amorphous silicon, poly-silicon, or similar material. Dummy layer 152 is then etched back to a thickness as shown in FIG. 6Q by etching or a combination of etching with CMP. The etch process may be reactive ion etch using SF6, SiCl4, C4F8, CH4, H2 or other known etch gases or combination thereof or wet etch using HF, HCl, TMAH or similar chemical or combination thereof. Dummy gate layer 152 is then patterned using standard lithographic and etching techniques to provide the structure of FIG. 6R.

Dielectric layer 154 is deposited and planarized using standard deposition and CMP techniques as shown in FIG. 6S. Dielectric layer 154 may be SiO2 or SiNx or similar material or combination thereof. Next, an opening 156 is formed using standard lithographic and etching techniques as shown in FIG. 6T. Next, dummy gate 152 is removed using SF6, SiCl4, C4F8, CH4, H2 or other known etch gases or combination thereof or wet etch using HF, HCl, TMAH or similar chemical or combination thereof. The portions of dummy gate dielectric 150 thus exposed, are also removed in this process. Gate dielectric 158 is then deposited using ALD technique to provide the structure shown in FIG. 6U. Gate dielectric 158 can be SiO2, HfO2, Al2O3, ZrO2 or similar material or combination thereof and may have a thickness of 1-10 nm. Next, opening 156 is extended vertically through gate dielectric 158 and dielectric layers 147 and 145 by etching to expose the top portion of gate 120 as shown in FIG. 6U. The etch process may be reactive ion etch or dry etch using SF6, SiCl4, C4F8, CH4, H2, Ar or other known etch gases or combination thereof.

Next, gate 124 is formed by filling opening 156 and the area vacated when dummy gate 152 was removed using standard selective CVD processes. Gate 124 may comprise TiN, TaN, W, Al, or similar material or combination thereof. The resulting structure is shown in FIG. 6V. The top portion of dummy gate layer 150 is then removed using standard etching techniques. Then, contacts 160 and 162 are deposited and patterned using standard techniques to provide the resulting structure of FIG. 6W. Contacts that are not shown will also be provided to shared contact 144 and the substrate 110 (Vdd).

In accordance with one embodiment of the present disclosure, a complementary transistor structure is provided. A lower portion of a column that includes one semiconductive material, such as germanium, is formed on a substrate comprising another semiconductor material, such as silicon. A first gate surrounds and is insulated from the lower portion of the column. An upper portion of the column is provided that includes yet another semiconductive material, such as indium arsenide. A second gate surrounds and is insulated from the lower portion of the column. An electrical contact to the upper portion of the column is provided above the second gate and a second electrical contact is provided to the upper and lower portion of the column between the first and second gates.

In accordance with another embodiment of the present disclosure, a method for forming complementary transistors is provided. A first semiconductor material, forming a lower portion of a column comprising a second semiconductive material, is formed on a semiconductive substrate. The first semiconductive material may be formed using a selective chemical vapor deposition process. A first gate is formed surrounding and insulated from the lower portion of the column. An upper portion of the column is formed including a third semiconductive material. The third semiconductive material may be formed using a selective chemical vapor deposition process using the first semiconductor material as a nucleation site. A second gate is formed surrounding and insulated from the lower portion of the column. Electrical contact to the upper portion of the column above the second gate and electrical contact to the upper and lower portion of the column between the first and second gates are then formed.

An advantage of the embodiments of the present disclosure is providing complementary transistors using a minimum of integrated circuit surface area.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a transistor, the method comprising:
on a substrate comprising a first semiconductor material, forming a lower portion of a column comprising a second semiconductive material;
forming a first gate surrounding and insulated from the lower portion of the column;
forming an upper portion of the column comprising a third semiconductive material;
forming a second gate surrounding and insulated from the lower portion of the column;
forming a first electrical contact to the upper portion of the column above the second gate; and
forming a second electrical contact to the upper and lower portion of the column between the first and second gates.

2. The method of claim 1, wherein the column is a circular cylinder.

3. The method of claim 1, wherein the step of forming the lower portion of the column is performed using selective chemical vapor deposition.

4. The method of claim 1, wherein the second semiconductive material is germanium.

5. The method of claim 1, wherein the step of forming the upper portion of the column is performed using selective chemical vapor deposition.

6. The method of claim 1, wherein the third semiconductive material is indium arsenide.

7. The method of claim 6, wherein the step of forming the upper portion of the column is performed using selective chemical vapor deposition wherein the selective chemical vapor deposition seeded by the lower portion of the column which comprises crystalline germanium.

8. A method for forming a transistor, the method comprising:
forming a first dielectric layer on a substrate;
forming a first gate layer on the first dielectric layer;
forming a second dielectric layer over the first gate layer;
forming a first source/drain contact layer on the second dielectric layer;
forming a third dielectric layer over the first source/drain contact layer;
forming a first opening, the first opening exposing a portion of the substrate, the first gate layer, and the first source/drain contact layer; and
forming a first nanowire in the first opening, the first nanowire being electrically connected to the first source/drain contact layer.

9. The method of claim 8, further comprising, after forming the first nanowire:
forming a second nanowire over the first nanowire, the second nanowire electrically coupled to the first source/drain contact layer and the first nanowire, the second nanowire extending above an upper surface of the third dielectric layer; and
forming a second gate layer adjacent the second nanowire.

10. The method of claim 9, wherein the first nanowire is formed of a different material than the second nanowire.

11. The method of claim 9, further comprising:
forming a fourth dielectric layer over the second gate layer;
forming a second opening exposing the first gate layer and the second gate layer; and
forming a conductive material in the second opening, wherein the conductive material contacts the first gate layer and the second gate layer.

12. The method of claim 9, further comprising:
forming a fourth dielectric layer over the second gate layer;
forming a second opening exposing the second gate layer;
removing the second gate layer, exposing the second nanowire and forming a third opening;
forming a fourth opening extending from a bottom of the third opening to the first gate layer; and
forming a conductive material in the second opening, the third opening, and the fourth opening, wherein the conductive material contacts the first gate layer, and wherein the conductive material forms a gate adjacent the second nanowire.

13. The method of claim 8, further comprising, prior to forming the first nanowire:
   forming a gate dielectric along sidewalls and a bottom of the first opening; and
   performing an anisotropic etch to remove the gate dielectric along horizontal surfaces, wherein the gate dielectric is interposed between the first nanowire and the first gate layer.

14. The method of claim 13, further comprising, after forming the gate dielectric, recessing the gate dielectric below an upper surface of the first nanowire.

15. The method of claim 8, wherein an upper surface of the first nanowire is higher than a lower surface of the first source/drain contact layer.

16. A method for forming a transistor, the method comprising:
   forming a first dielectric layer on a substrate, the first dielectric layer having a first opening;
   forming a first nanowire in the first opening, the first nanowire extending above an upper surface of the first dielectric layer;
   forming a sacrificial gate layer on the first dielectric layer, the sacrificial gate layer being electrically coupled to the first nanowire;
   forming a second dielectric layer over the sacrificial gate layer;
   forming a first opening in the second dielectric layer to expose the sacrificial gate layer;
   removing the sacrificial gate layer, thereby forming a second opening; and
   forming a first gate layer in the second opening.

17. The method of claim 16, further comprising:
   forming a source/drain layer over the first nanowire;
   forming a third dielectric layer over the source/drain layer;
   forming a third opening extending through the third dielectric layer and the source/drain layer to the first nanowire; and
   forming a second nanowire in the third opening, the second nanowire contacting the first nanowire.

18. The method of claim 17, wherein the first nanowire is formed of a different material than the second nanowire.

19. The method of claim 17, further comprising:
   forming a second gate layer over the third dielectric layer.

20. The method of claim 19, further comprising:
   forming a fourth dielectric layer over the second gate layer;
   forming a second opening exposing the second gate layer; and
   forming a conductive material in the second opening.

* * * * *